(12) United States Patent
Yoshizumi et al.

(10) Patent No.: US 12,003,183 B2
(45) Date of Patent: Jun. 4, 2024

(54) POWER CONVERSION DEVICE AND POWER CONVERSION UNIT

(71) Applicant: TOSHIBA MITSUBISHI-ELECTRIC INDUSTRIAL SYSTEMS CORPORATION, Chuo-ku (JP)

(72) Inventors: Yuki Yoshizumi, Tokyo (JP); Nobuhiro Takahashi, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 772 days.

(21) Appl. No.: 17/050,627

(22) PCT Filed: Apr. 26, 2018

(86) PCT No.: PCT/JP2018/017036
§ 371 (c)(1),
(2) Date: Oct. 26, 2020

(87) PCT Pub. No.: WO2019/207723
PCT Pub. Date: Oct. 31, 2019

(65) Prior Publication Data
US 2021/0242795 A1    Aug. 5, 2021

(51) Int. Cl.
*H02M 7/00* (2006.01)
*H02M 7/537* (2006.01)

(52) U.S. Cl.
CPC ............ *H02M 7/003* (2013.01); *H02M 7/537* (2013.01)

(58) Field of Classification Search
CPC .............................. H02M 7/003; H02M 7/537
See application file for complete search history.

(56) References Cited

U.S. PATENT DOCUMENTS 9,750,147 B2 *   8/2017  Kosuga .............. H05K 5/0017
2006/0038549 A1  2/2006  Mehrotra et al.
(Continued)

FOREIGN PATENT DOCUMENTS

CN    204168155 U    2/2015
GB      2539537 A   12/2016
(Continued)

OTHER PUBLICATIONS

Partial Supplementary European Search Report dated Nov. 10, 2021 in corresponding European Patent Application No. 189158591.5, 14 pages.
(Continued)

*Primary Examiner* — Carlos Amaya
(74) *Attorney, Agent, or Firm* — Oblon, McClelland, Maier & Neustadt, L.L.P.

(57) ABSTRACT

A power conversion device includes: a housing including a floor, a ceiling, a front face; an input circuit part; a power conversion unit; a reactor; an output circuit; and an output terminal. These elements are arranged in a planar direction of the front face so as not to overlap each other. The input circuit part is provided above the floor, the output circuit part is provided below the ceiling and above the input circuit part, and the power conversion unit is provided above the input circuit part between the input circuit part and the output circuit part. The reactor is provided beside or above the power conversion unit between the input circuit part and the output circuit part. The input circuit part, the power conversion unit, the reactor, the output circuit part, and the output terminal are connected in series in this order through metal bus bars.

6 Claims, 29 Drawing Sheets

(56) References Cited

U.S. PATENT DOCUMENTS

2014/0036418 A1* 2/2014 Eichler .................. H02B 1/32
                                                                                     361/605
2014/0111959 A1    4/2014 Li et al.

FOREIGN PATENT DOCUMENTS

| JP | 2013-251569 A | 12/2013 |
|---|---|---|
| WO | WO 2014/171023 A1 | 10/2014 |
| WO | WO 2018/030035 A1 | 2/2018 |

OTHER PUBLICATIONS

Indian Office Action dated Apr. 23, 2021 in Indian Patent Application No. 202017050061, 5 pages.
Extended European Search Report dated Mar. 11, 2022 in European Patent Application No. 18915859.5, 20 pages.
International Preliminary Report on Patentability and Written Opinion dated Nov. 5, 2020 in PCT/JP2018/017036 (submitting English translation only), 7 pages.
Combined Chinese Office Action and Search Report dated Apr. 21, 2023 in Chinese Patent Application No. 201880092737.7 (with unedited computer-generated English Translation), 17 pages.
International Search Report dated Jun. 12, 2018 in PCT/JP2018/017036 filed on Apr. 26, 2018, 1 page.
Hearing Notice dated Dec. 21, 2023, issued in counterpart IN Application No. 202017050061, with English Translation, citing document No. 1. (2 pages).

* cited by examiner

BACK VIEW

BACK VIEW

ENLARGED VIEW OF S PORTION IN FIG. 11

A-A

C-C

POWER CONVERSION DEVICE AND POWER CONVERSION UNIT

FIELD

The present disclosure relates to a power conversion device and a power conversion unit.

BACKGROUND

In the related art, as described in WO 2014/171023 for example, a power conversion device having an inverter, a circuit component, and a metal bus bar contained in a single housing is known. As illustrated in diagrams such as FIG. 1 of the cited literature, in the power conversion device according to the above technology of the related art, the metal bus bar extends circumferentially so as to surround a central circuit component (capacitor). Six power semiconductor devices are likewise arranged circumferentially on the outside of the metal bus bar.

CITATION LIST

Patent Literature

[PTL 1] WO 2014/171023 A

SUMMARY

Technical Problem

Power conversion devices having a plurality of components contained in a box-shaped housing such that the components do not overlap each other in a plan view are prevalent. The plurality of components include components such as power conversion units, reactors, a breaker, and interconnecting metal bus bars. Because power conversion devices of this type are used to convert somewhat large amounts of power, the components also tend to be relatively bulky. The plurality of components are housed in a limited space inside the housing according to a predetermined component layout, and the metal bus bars that connect the components are also provided.

Depending on the component layout inside the housing, the total length of the metal bus bars extending between the components may be too long in some cases. To describe this problem, assume a component layout in which the components and the metal bus bars are provided such that circuit wires run back and forth between either end of the housing in the vertical direction, the vertical direction being the direction parallel to the axis that joins the floor and the ceiling of the housing. Such a method of connecting components so that the circuit wires substantially run back and forth throughout the entire length inside the housing is also referred to as the "round-trip component connection method". With the "round-trip component connection method", the circuit wires run back and forth throughout the entire length of the housing, and therefore the demanded wiring length is approximately double or more than double the total length of the housing. Consequently, with the round-trip component connection method, the circuit wiring length may easily become long enough to be inefficient. As a result, the total length of the metal bus bars is lengthened.

The length of a metal bus bar is proportional to the amount of metal material forming the metal bus bar, and there are drawbacks, such as the metal bus bar becoming more costly as a larger amount of metal material is used. The component layout according to the related technology is designed with emphasis on properties such as component replaceability and insulation specifications, whereas the perspective of shortening the length of the circuit wires is not emphasized. Actually, in the device according to WO 2014/171023 described above for example, because the metal bus bar is long enough to run substantially the entire circumference of a cylindrical housing, there is still room for improvement with regard to shortening the metal bus bar. As a result of thorough research on the basis of such circumstances, the inventor has discovered a novel technology related to shortening the wiring length in a power conversion device.

The present application has been made to address problems like the above, and an object thereof is to provide an improved power conversion device for shortening the wiring length.

Further, the larger the size of the power conversion unit, the greater the space that the power conversion unit occupies inside the housing, and therefore miniaturization of the power conversion unit itself is also desired.

Another object of the present application is to provide an improved power conversion unit for miniaturization.

Solution to Problem

The power conversion device according to the present invention includes:
a housing having a floor, a ceiling provided above the floor, and a front face, a back face, and a pair of side faces that join the floor and the ceiling;
an input circuit part, a power conversion unit, a reactor, and an output circuit part housed inside the housing; and
an output terminal provided in the ceiling,
wherein
the input circuit part, the power conversion unit, the reactor, and the output circuit part are arranged in a planar direction of the front face so as not to overlap each other in a plan view of the front face, the input circuit part is provided above the floor, the output circuit part is provided below the ceiling and above the input circuit part, the power conversion unit is provided between the input circuit part and the output circuit part, and the reactor is provided beside or above the power conversion unit between the input circuit part and the output circuit part, and
with an axis in a direction from the floor to the ceiling being considered as a vertical coordinate axis, the input circuit part, the power conversion unit, the reactor, and the output circuit part are connected in series in this order through a plurality of metal bus bars that each extend vertically.

A power conversion unit according to the present disclosure is provided with:
a power conversion module that converts between direct-current power and alternating-current power; and
a laminate bus bar provided with a direct-current input terminal through which direct-current power is input, a direct-current intermediary terminal that transmits the direct-current power to the power conversion module, an alternating-current intermediary terminal that receives alternating-current power from the power conversion module, and an alternating-current output terminal that outputs the alternating-current power received by the alternating-current intermediary terminal, wherein the laminate bus bar includes
a plurality of conductive layers stacked on each other and
an insulator sandwiched between each adjacent pair of the plurality of conductive layers,
one of the plurality of conductive layers includes a direct-current conductive plate having the direct-current input terminal and the direct-current intermediary terminal,
another of the plurality of conductive layers includes an alternating-current conductive plate having the alternating-current intermediary terminal and the alternating-current output terminal, and
the laminate bus bar is constructed such that a portion of the direct-current conductive plate and a portion of the alternating-current conductive plate overlap each other in a plan view of the laminate bus bar.

The term "above" refers to the direction of the ceiling as viewed from the floor, or in other words upward in the vertical direction. The term "beside" refers to the direction from one side face to the opposite side face, or in other words the horizontal direction. In the power conversion device according to the present application, a "one-way component connection method" is used. In the one-way component connection method, a plurality of components are arranged inside the housing going one way from the floor to the ceiling, with the components being connected to each other by metal bus bars that extend in the vertical direction. According to the one-way component connection method, the metal bus bars can be shortened compared to the round-trip component connection method described above.

Advantageous Effects of Invention

According to the power conversion unit of the present application, the planar dimension of the laminate bus bar can be shortened by partially overlapping the DC conductive plate and the AC conductive plate. With this arrangement, the power conversion unit as a whole can be miniaturized.

DESCRIPTION OF EMBODIMENTS

Embodiment of Power Conversion Device

Figure 1:
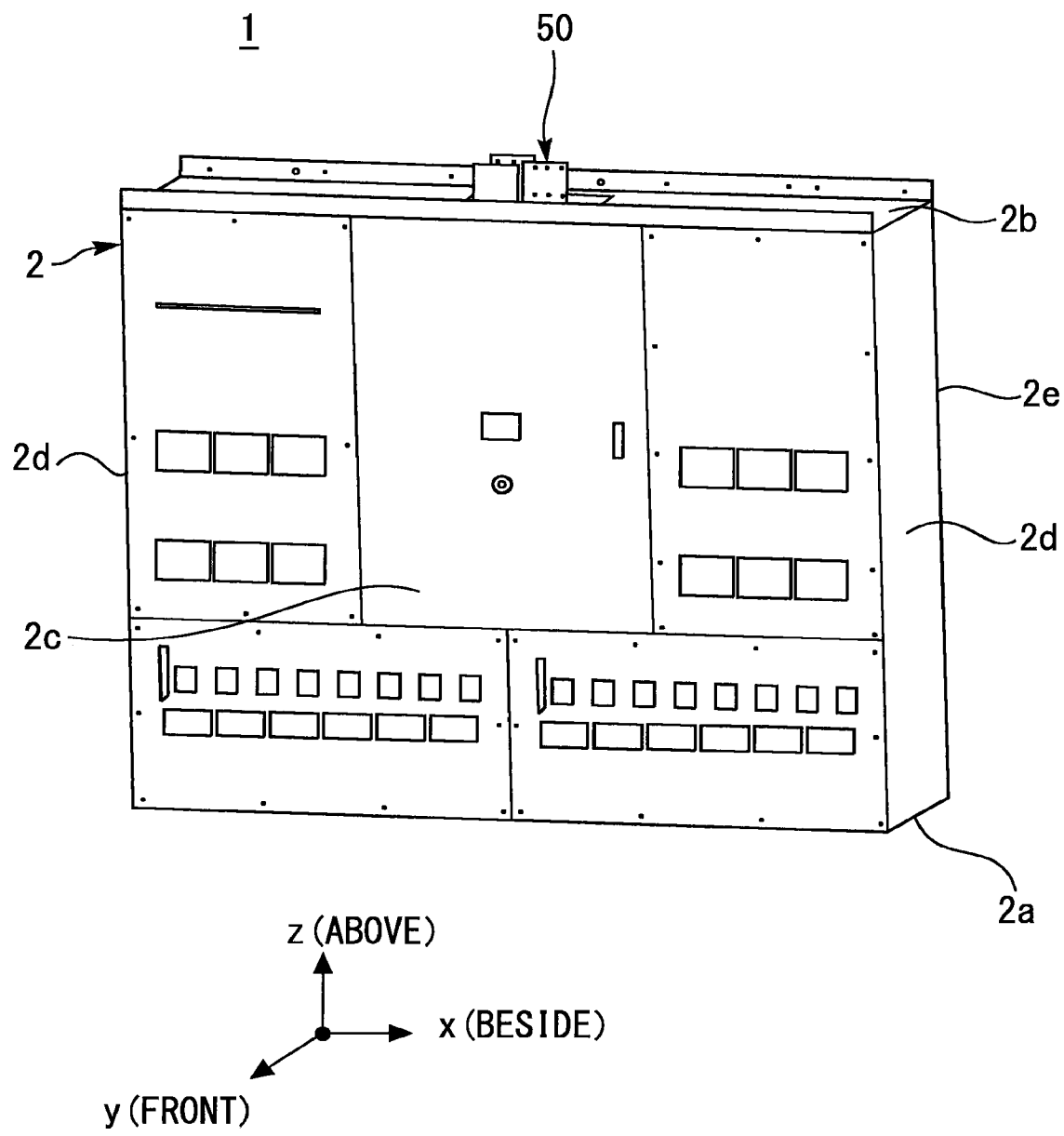
FIG. 1 is a front perspective view illustrating the external appearance of a power conversion device according to an embodiment.

FIG. 1 is a front perspective view illustrating the external appearance of a power conversion device 1 according to the embodiment. The power conversion device 1 is provided with a housing 2. The housing 2 is a rectangular box-shaped housing. Specifically, the housing 2 has a floor 2*a*, a ceiling 2*b* provided above the floor 2*a*, a front face 2*c* that acts as a front cover, a back face 2e that acts as a back cover, and a pair of side faces 2d. Each of the front face 2c, the back face 2e, and the pair of side faces 2d joins an edge of the floor 2a to an edge of the ceiling 2b.

In the diagrams, xyz orthogonal coordinates are indicated for convenience. In the embodiment, "above" is the positive z direction, and refers to the direction going toward the ceiling 2b as viewed from the floor 2a. "Beside" is the direction parallel to the x coordinate axis, and refers to the direction from one side face 2d to the opposite side face. For simplicity, the cases where simply "beside" is used refers to either the positive x direction or the negative x direction without distinguishing between the two. "Front" is the positive y direction, and refers to the direction from the back face toward the front face of the power conversion device 1.

The direction parallel to the z coordinate axis is also referred to as the "vertical direction", without distinguishing between the positive z direction and the negative z direction. The direction parallel to the x coordinate axis is also referred to as the "horizontal direction", without distinguishing between the positive x direction and the negative x direction. The direction parallel to the y axis is also referred to as the "front-back direction", without distinguishing between the positive y direction and the negative y direction.

A "front view" refers to a perspective viewing the front of the power conversion device 1 in a direction parallel to the y coordinate axis going in the negative y direction. A "back view" refers to a perspective viewing the front of the power conversion device 1 in a direction parallel to the y coordinate axis going in the positive y direction. A "front view" and a "back view" are both assumed to be a "plan view of the front face 2c". "Above, that is, in the positive z direction" and "beside, that is, in a direction parallel to the x coordinate axis" are orthogonal in a front view.

Figure 2:
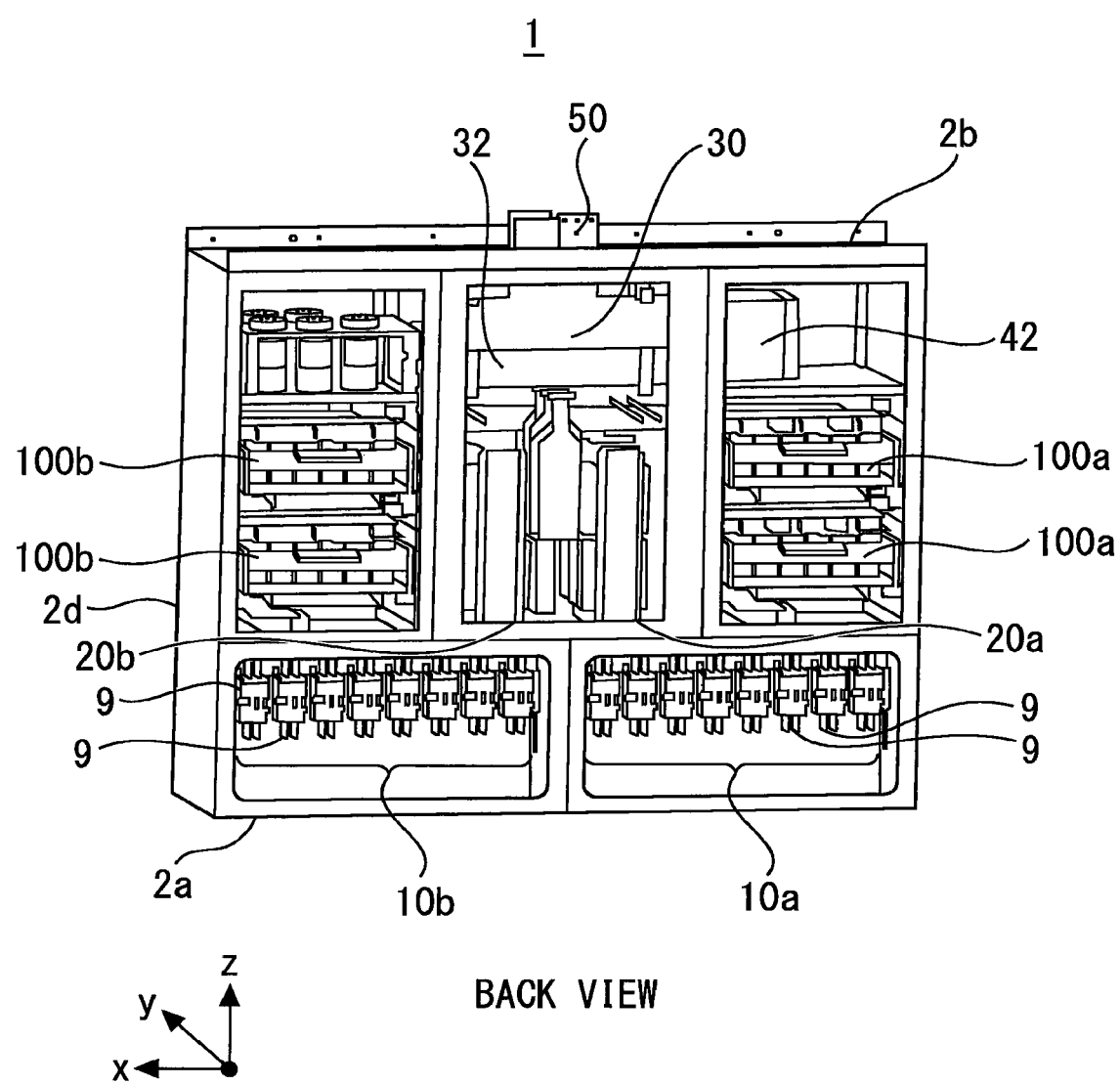
FIG. 2 is a back perspective view illustrating the internal structure of the power conversion device according to the embodiment.
Figure 3:
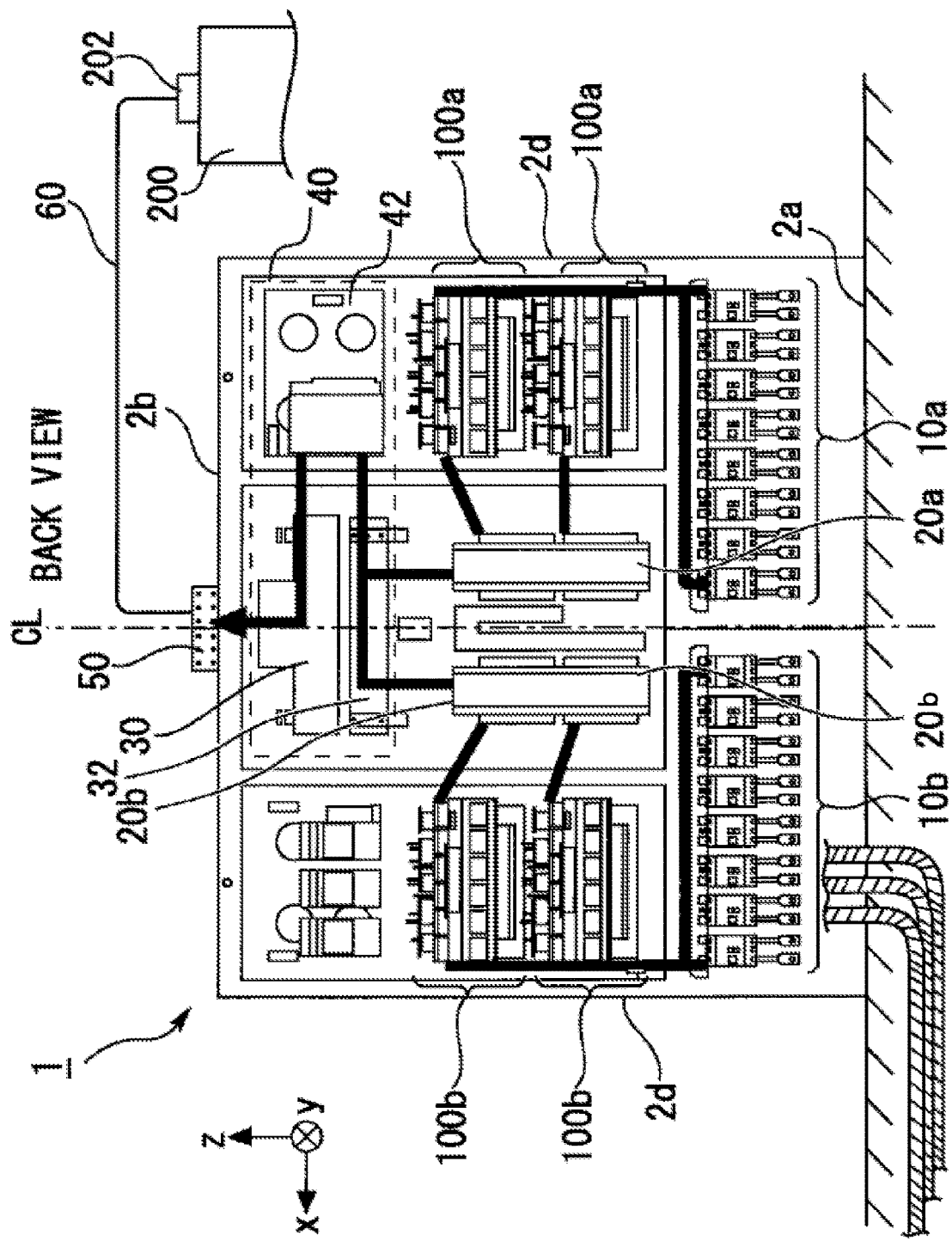
FIG. 3 is a back view illustrating the internal structure of the power conversion device according to the embodiment.
Figure 22:
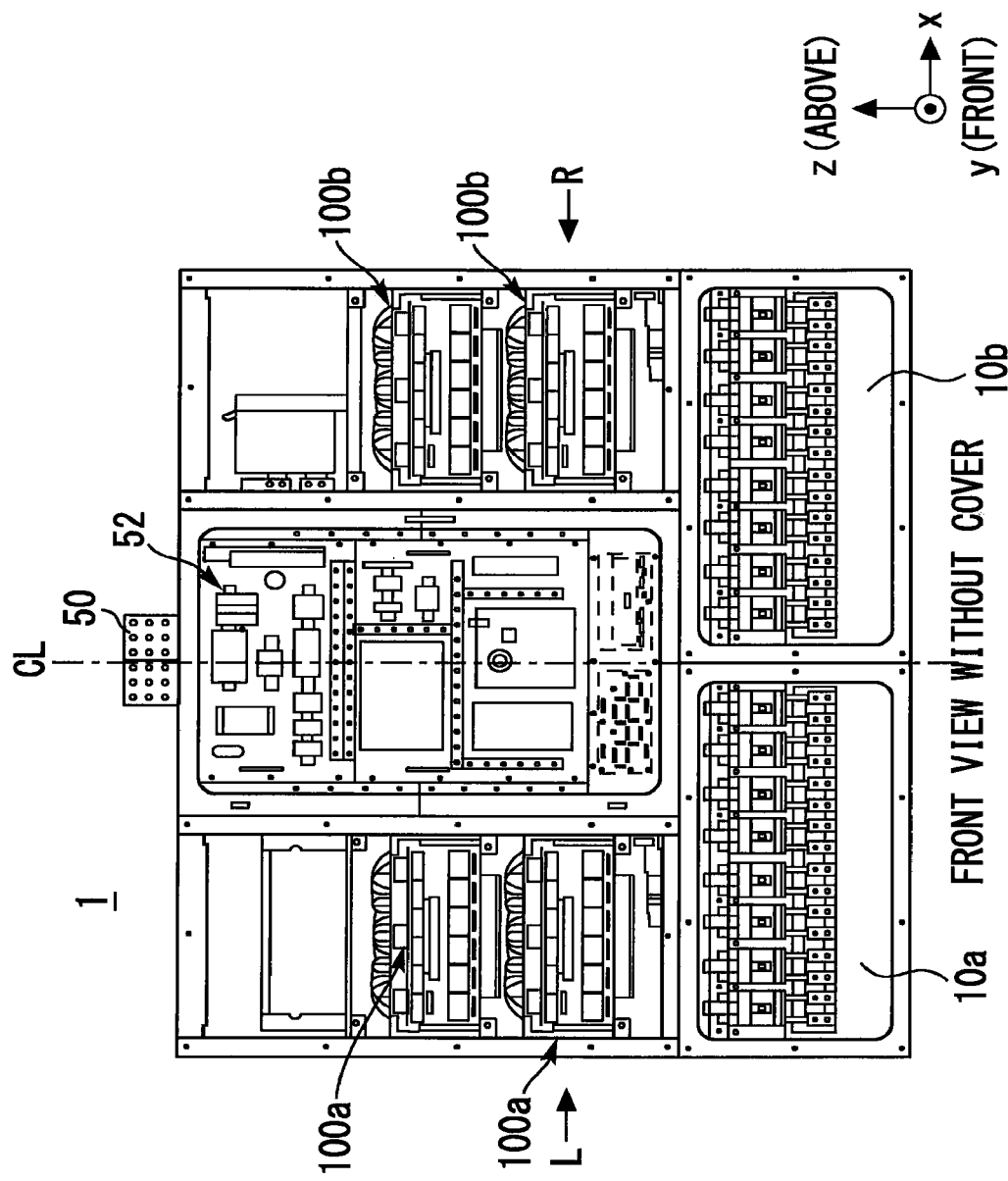
FIG. 22 is a front view illustrating the internal structure of the power conversion device according to the embodiment.
Figure 23:
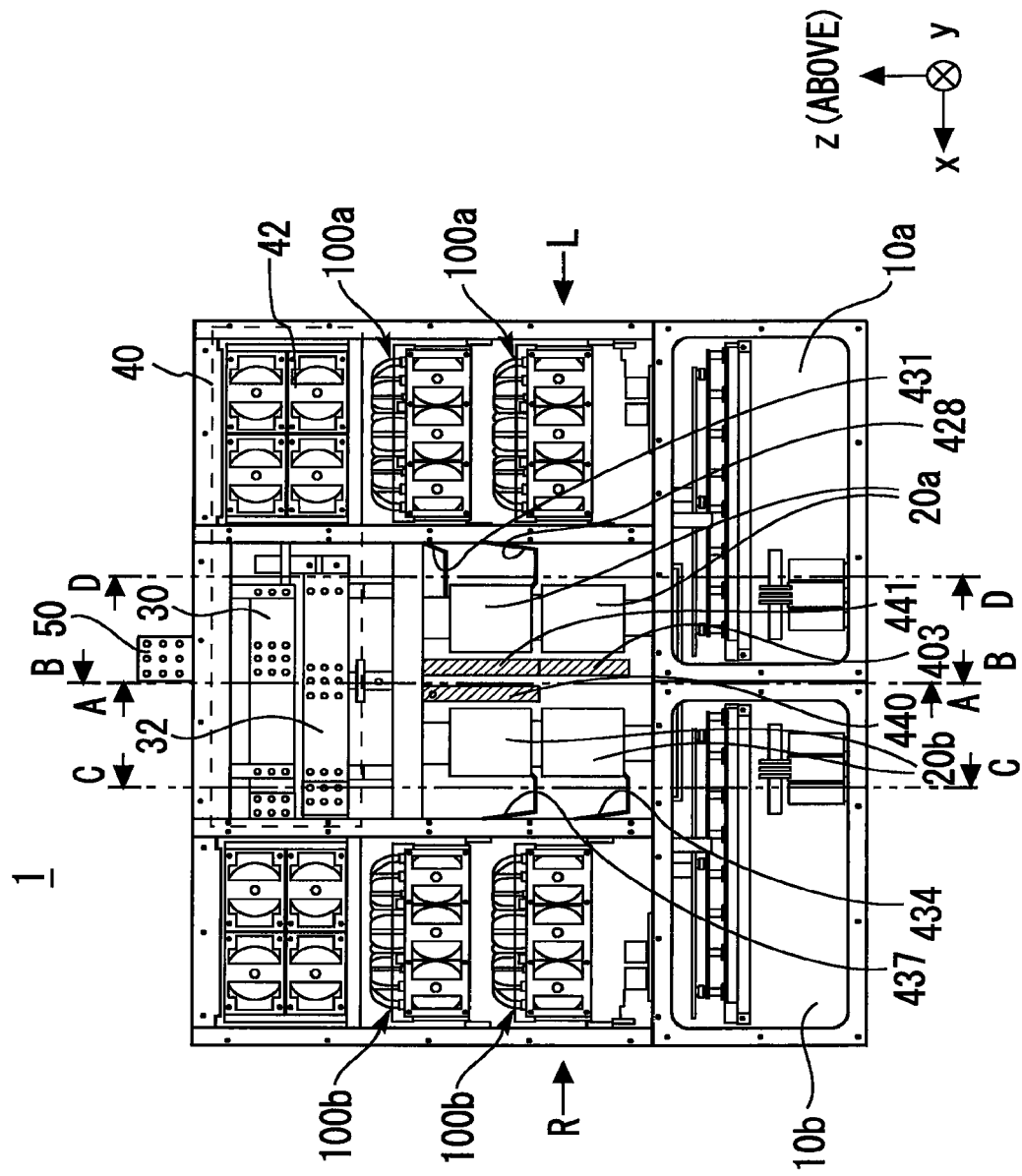
FIG. 23 is a back view illustrating the internal structure of the power conversion device according to the embodiment.

FIG. 2 is a back perspective view illustrating the internal structure of the power conversion device 1 according to the embodiment. FIG. 3 is a back view illustrating the internal structure of the power conversion device 1 according to the embodiment. FIG. 22 is a front view illustrating the internal structure of the power conversion device 1 according to the embodiment. FIG. 23 is a back view illustrating the internal structure of the power conversion device 1 according to the embodiment. Hereinafter, these diagrams will be used to describe the internal structure of the power conversion device 1.

The power conversion device 1 is an assembly of components for forming a power conversion circuit, such as a three-phase alternating current inverter, inside the housing 2. Namely, the power conversion device 1 is provided with a first input circuit part 10a, a second input circuit part 10b, a plurality of first power conversion units 100a, a plurality of second power conversion units 100b, a plurality of first reactors 20a, a plurality of second reactors 20b, an output circuit part 40, and an output terminal 50 provided penetrating through the ceiling 2b. The power conversion device 1 is also provided with a plurality of metal bus bars that connect the above components. In FIG. 23, metal bus bars 403, 428, 431, 434, 437, 440, and 441 are illustrated, but other metal bus bars will be described later using FIGS. 24 to 29. In the embodiment, the metal bus bars are all assumed to be formed using copper (Cu).

As the various plan views in FIGS. 3, 22, and 23 demonstrate, the first input circuit part 10a, the second input circuit part 10b, the plurality of first power conversion units 100a, the plurality of second power conversion units 100b, the plurality of first reactors 20a, the plurality of second reactors 20b, and the output circuit part 40 are arranged in the planar direction of the front face 2c to not overlap with each other in a plan view of the front face 2c. Referring to the directions defined using the xyz orthogonal coordinates described earlier, the first input circuit part 10a and the second input circuit part 10b are provided above the floor 2a. Also, the output circuit part 40 is provided below the ceiling 2b and above the first input circuit part 10a and the second input circuit part 10b. Note that, as illustrated in the front view of FIG. 22, a control circuit board 52 is disposed centrally near the front face 2c.

The first power conversion units 100a and the first reactors 20a are arranged horizontally adjacent to each other in the plan view of the front face 2c, sandwiched between the first input circuit part 10a and the output circuit part 40. Similarly, the second power conversion units 100b and the second reactors 20b are arranged horizontally adjacent to each other in the plan view of the front face 2c, sandwiched between the second input circuit part 10b and the output circuit part 40. The first power conversion units 100a and the second power conversion units 100b are provided above the first input circuit part 10a and the second input circuit part 10b between the first input circuit part 10a or the second input circuit part 10b and the output circuit part 40. The first reactors 20a and the second reactors 20b are provided beside the first power conversion units 100a and the second power conversion units 100b between the first input circuit part 10a or the second input circuit part 10b and the output circuit part 40.

Through the metal bus bars 403, 428, 431, 434, 437, 440, and 441 illustrated in FIG. 23 and the other metal bus bars (see FIGS. 24 to 29), the plurality of components inside the housing 2 form two series circuits. Each of the plurality of metal bus bars extends vertically in the plan view of FIG. 23, or in other words straight and parallel with the z coordinate axis.

For convenience, the series circuit formed by the series connection of the first input circuit part 10a, the first power conversion units 100a, and the first reactors 20a in this order is also referred to as the "left-side series circuit". Likewise, for convenience, the series circuit formed by the series connection of the second input circuit part 10b, the second power conversion units 100b, and the second reactors 20b in this order is also referred to as the "right-side series circuit". The left-side series circuit and the right-side series circuit are made to converge at the output circuit part 40, and the output circuit part 40 is additionally connected to the output terminal 50.

According to the power conversion device 1 according to the embodiment, the first input circuit part 10a, the second input circuit part 10b, the first power conversion units 100a, the second power conversion units 100b, the first reactors 20a, the second reactors 20b, and the output circuit part 40 arranged in a planar configuration inside the housing 2 can be connected in a "one-way" configuration overall proceeding from the floor 2a to the ceiling 2b. Here, the term "one-way" means that circuit wiring originating near the floor 2a proceeds toward the ceiling 2b without returning to the floor 2a, and ultimately reaches the component closest to the ceiling 2b.

In the embodiment, for convenience, a method of arranging and connecting components in such a "one-way" configuration is also referred to as the "one-way component connection method". Compared to a "round-trip component connection method" according to a comparative example in diagrams such as FIG. 4 described later, the "one-way component connection method" according to the embodiment has an advantage of shortening the total wiring length of the series circuit to the output terminal 50 from each of the first input circuit part 10*a* and the second input circuit part 10*b*. Because the total wiring length is short, the total length of the metal bus bars can also be reduced.

Furthermore, according to the embodiment, the output terminal 50 is provided in the ceiling 2*b*. As illustrated in FIG. 3, a transformer 200 provided adjacent to the power conversion device 1 has a transformer input terminal 202 on an upper edge, thereby improving convenience when connecting the output terminal 50 of the power conversion device 1 to the transformer input terminal 202 of the transformer 200.

As illustrated in FIG. 3, assume that a predetermined reference axis CL is provided passing through the floor 2*a* and the ceiling 2*b* in the plan view of the front face 2*c*. In the embodiment, the straight line passing through the center of the floor 2*a* and the center of the ceiling 2*b* is taken to be the reference axis CL. The space inside the housing 2 is divided into two spaces by the reference axis CL, and the circuit structures inside the two spaces are constructed to be symmetrical with each other.

In other words, in the embodiment, the first input circuit part 10*a* is provided, and the second input circuit part 10*b* is provided at a position that is line-symmetric with the first input circuit part 10*a* using the reference axis CL as the line of symmetry. Additionally, the first power conversion units 100*a* are provided, and the second power conversion units 100*b* are provided at positions that are line-symmetric with the first power conversion units 100*a* using the reference axis CL as the line of symmetry. Additionally, the first reactors 20*a* are provided, and the second reactors 20*b* are provided at positions that are line-symmetric with the first reactors 20*a* using the reference axis CL as the line of symmetry.

The "left-side series circuit" and the "right-side series circuit" described earlier are each provided according to the "one-way component connection method" described earlier. According to the embodiment, when parallelizing the left-side series circuit and the right-side series circuit, the components are disposed to be line-symmetric with each other. With this arrangement, the space inside the housing 2 can be used efficiently with minimal wasted space. Consequently, the large capacity power conversion device 1 having a short wiring length can be constructed as compactly as possible.

As illustrated in FIG. 3, the output circuit part 40 is provided with a relay bus bar 32, an output-side breaker 42, and an output bus bar 30. The relay bus bar 32 is provided above the first reactors 20*a* and the second reactors 20*b*. The output-side breaker 42 is provided beside the relay bus bar 32. The output bus bar 30 is provided above the relay bus bar 32 and beside the output-side breaker 42. The relay bus bar 32, the output-side breaker 42, the output bus bar 30, and the output terminal 50 are interconnected to form a series circuit.

According to the embodiment, because the output circuit part 40 is shared in common downstream of the first reactors 20*a* and the second reactors 20*b*, the number of components can be reduced.

The first input circuit part 10*a* and the second input circuit part 10*b* are disposed side by side above the floor 2*a*. The first power conversion units 100*a* are provided above the first input circuit part 10*a*. The second power conversion units 100*b* are provided above the second input circuit part 10*b*. The first reactors 20*a* and the second reactors 20*b* are sandwiched between the first power conversion units 100*a* and the second power conversion units 100*b*. As illustrated in FIG. 3, the first power conversion units 100*a*, the first reactors 20*a*, the second reactors 20*b*, and the second power conversion units 100*b* are arranged in this order in a row proceeding in the x direction.

Circuits are formed by grouping the first power conversion units 100*a* and the second power conversion units 100*b* provided on either outer side to the first reactors 20*a* and second reactors 20*b* provided on the inner side, while in addition, the "left-side series circuit" and the "right-side series circuit" described earlier can be made to converge at the relay bus bar 32 disposed above. This has an advantage in that the circuit wiring length joining the first reactors 20*a*, the second reactors 20*b*, and the output terminal 50 can be shortened even more.

As illustrated in FIGS. 2 and 3, each of the first input circuit part 10*a* and the second input circuit part 10*b* includes a plurality of small input-side breakers 9. The plurality of small input-side breakers 9 are each provided with a power input terminal. The plurality of small input-side breakers 9 inside the first input circuit part 10*a* are divided into at least two groups, and the pluralities of small input-side breakers 9 in the groups are connected in parallel with each other. The same applies to the plurality of small input-side breakers 9 inside the second input circuit part 10*b*.

For example, in the case of using the power conversion device 1 in a photovoltaic power generation system, the power input wires of each of a plurality of photovoltaic arrays are bundled together and connected to the power conversion device 1. The plurality of strings are made to converge on the output side of the plurality of small input-side breakers 9, and the converged wires are connected to each of the first power conversion units 100*a* and the second power conversion units 100*b*. According to the embodiment, the power conversion device 1 can be given such a function of combining a plurality of power input wires. As a result, because a function of combining the plurality of power wiring strings does not have to be provided in the equipment upstream of the first input circuit part 10*a* and the second input circuit part 10*b*, the cost of the upstream equipment can be lowered.

As illustrated in FIGS. 2 and 3, the plurality of small input-side breakers 9 forming the first input circuit part 10*a* and the second input circuit part 10*b* are arranged above the floor 2*a* from one of the pair of side faces 2*d* to the other side face 2*d*. Above the row of the plurality of small input-side breakers 9, the first power conversion units 100*a*, the first reactors 20*a*, the second reactors 20*b*, and the second power conversion units 100*b* are arranged horizontally in a row. Because components can be disposed in a row above the plurality of small input-side breakers 9 arranged horizontally, the space inside the housing 2 can be used to store each component compactly with minimal wasted space.

Figure 24:
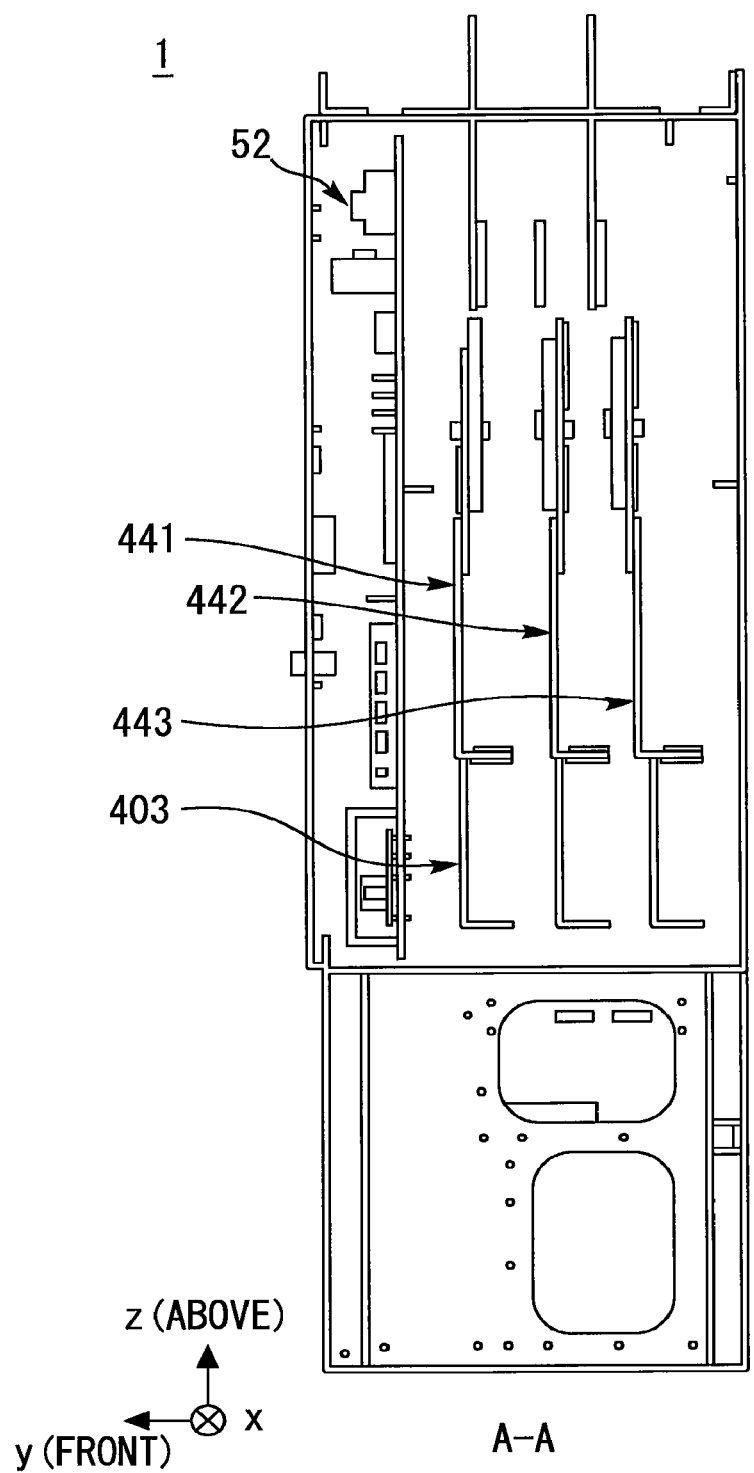
FIG. 24 is a sectional view of A-A in FIG. 23 of the power conversion device according to the embodiment.
Figure 25:
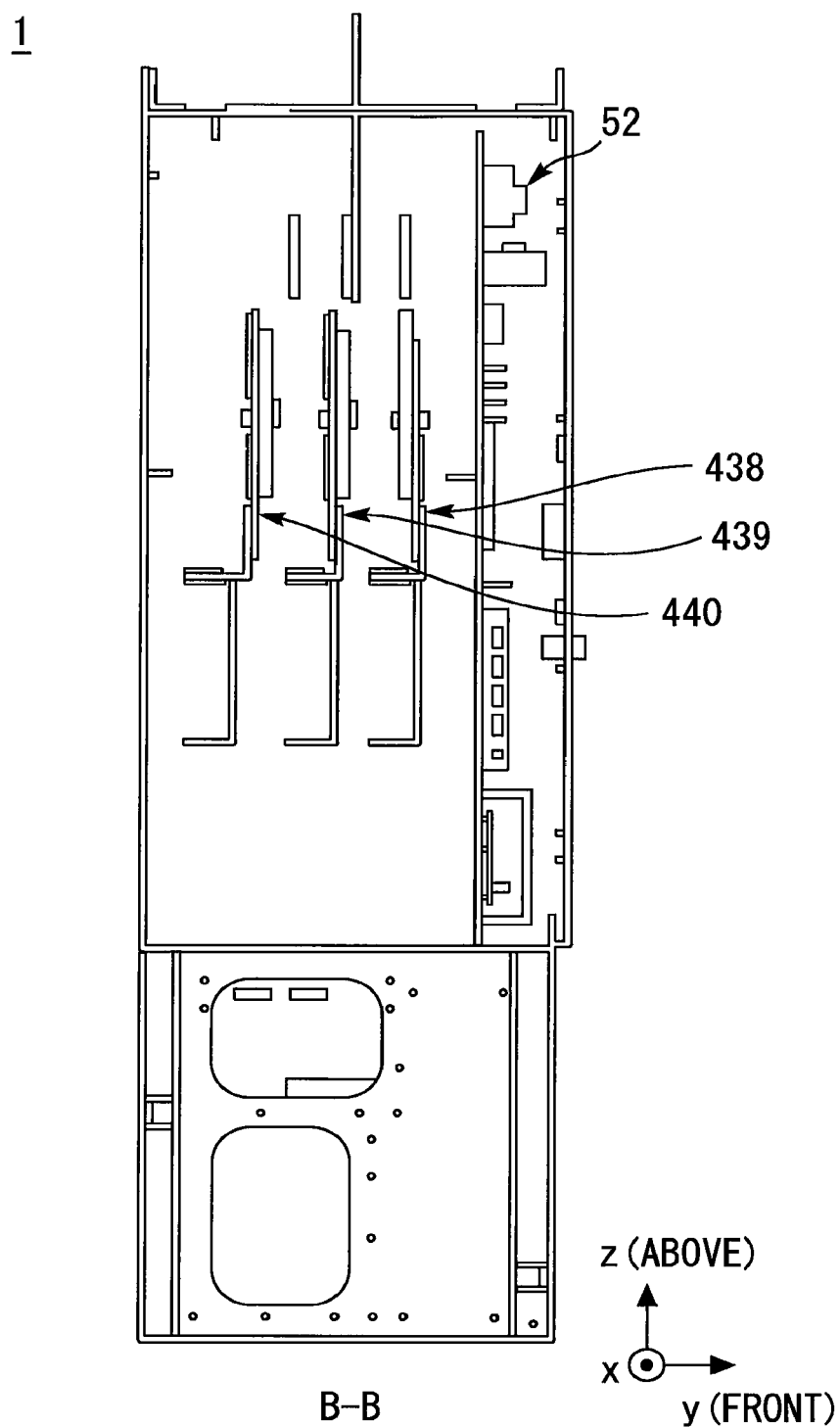
FIG. 25 is a sectional view of B-B in FIG. 23 of the power conversion device according to the embodiment.

FIGS. 24 to 29 will be used to describe the structure of the metal bus bar group that connects components inside the power conversion device 1. FIG. 24 is a sectional view of A-A in FIG. 23 of the power conversion device 1 according to the embodiment. In FIG. 24, a plurality of metal bus bars 403, 441, 442, and 443 that connect the first reactors 20*a* and the relay bus bar 32 are illustrated. FIG. 25 is a sectional view of B-B in FIG. 23 of the power conversion device 1 according to the embodiment. In FIG. 25, a plurality of metal bus bars 438, 439, and 440 that connect the second reactors 20*b* and the relay bus bar 32 are illustrated.

Figure 26:
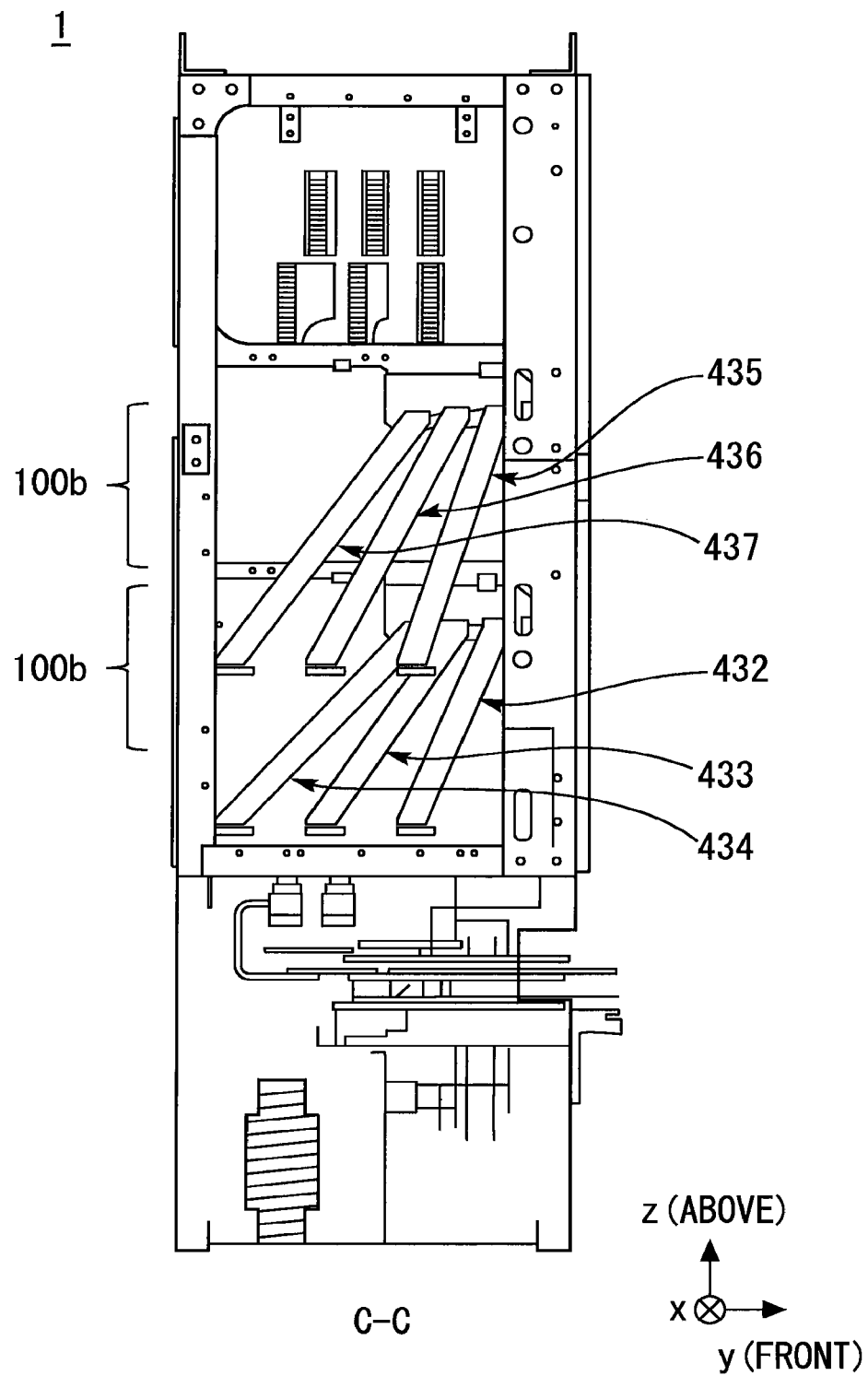
FIG. 26 is a sectional view of C-C in FIG. 23 of the power conversion device according to the embodiment.
Figure 27:
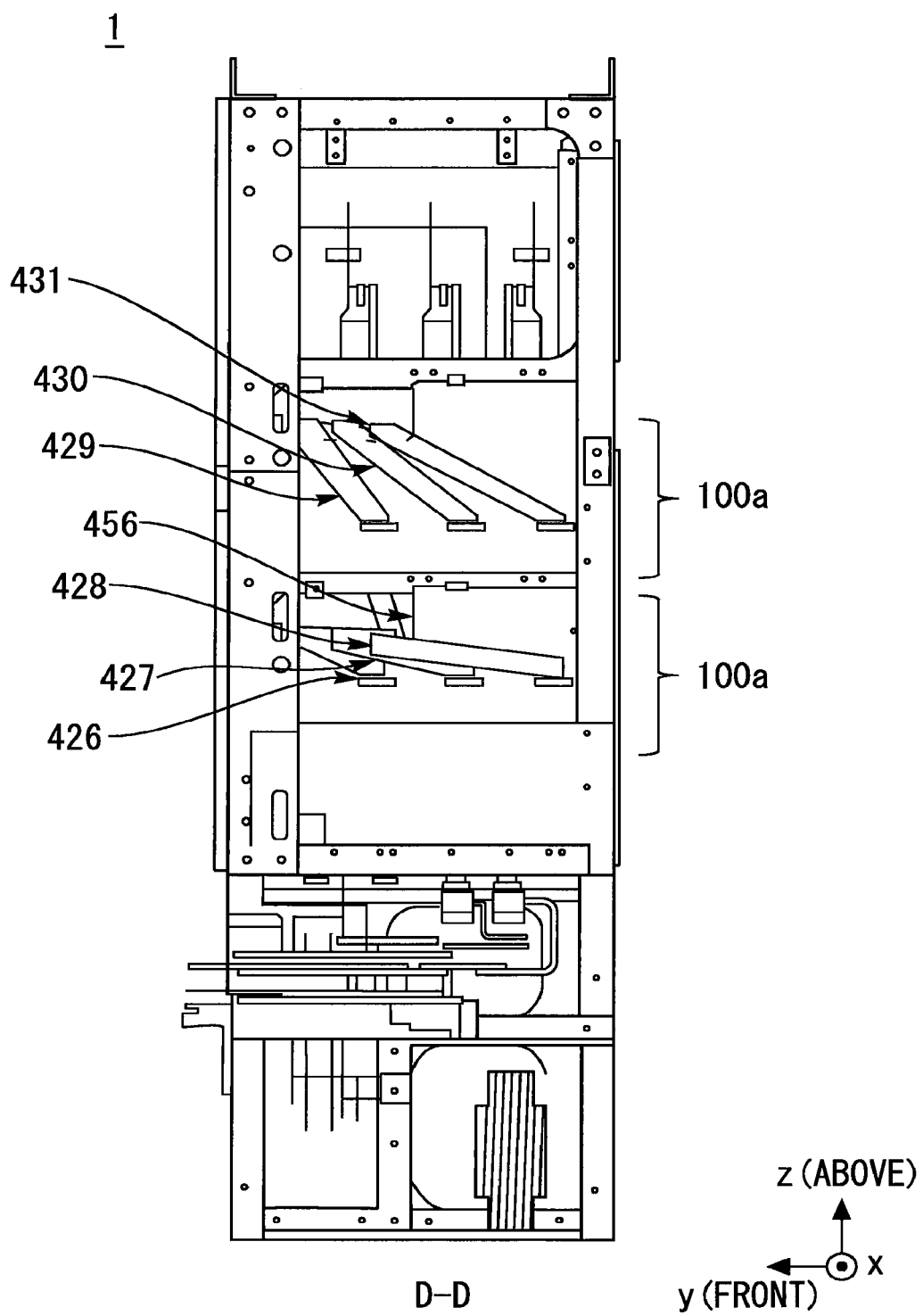
FIG. 27 is a sectional view of D-D in FIG. 23 of the power conversion device according to the embodiment.

FIG. 26 is a sectional view of C-C in FIG. 23 of the power conversion device 1 according to the embodiment. In FIG. 26, a plurality of metal bus bars 432, 433, 434, 435, 436, and 437 that connect the second power conversion units 100*b* and the second reactors 20*b* are illustrated. FIG. 27 is a sectional view of D-D in FIG. 23 of the power conversion device 1 according to the embodiment. In FIG. 27, a plurality of metal bus bars 426, 427, 428, 429, 430, and 431 that connect the first power conversion units 100*a* and the first reactors 20*a* are illustrated.

As FIGS. 26 and 27 demonstrate, the plurality of metal bus bars 426 to 437 extend obliquely with respect to the z coordinate axis and in straight lines in a plane parallel to the zy plane. Routing the metal bus bars in such diagonal lines makes it possible to dispose the metal bus bars over the shortest distance and dramatically reduce the amount of metal bus bar material used.

Figure 28:
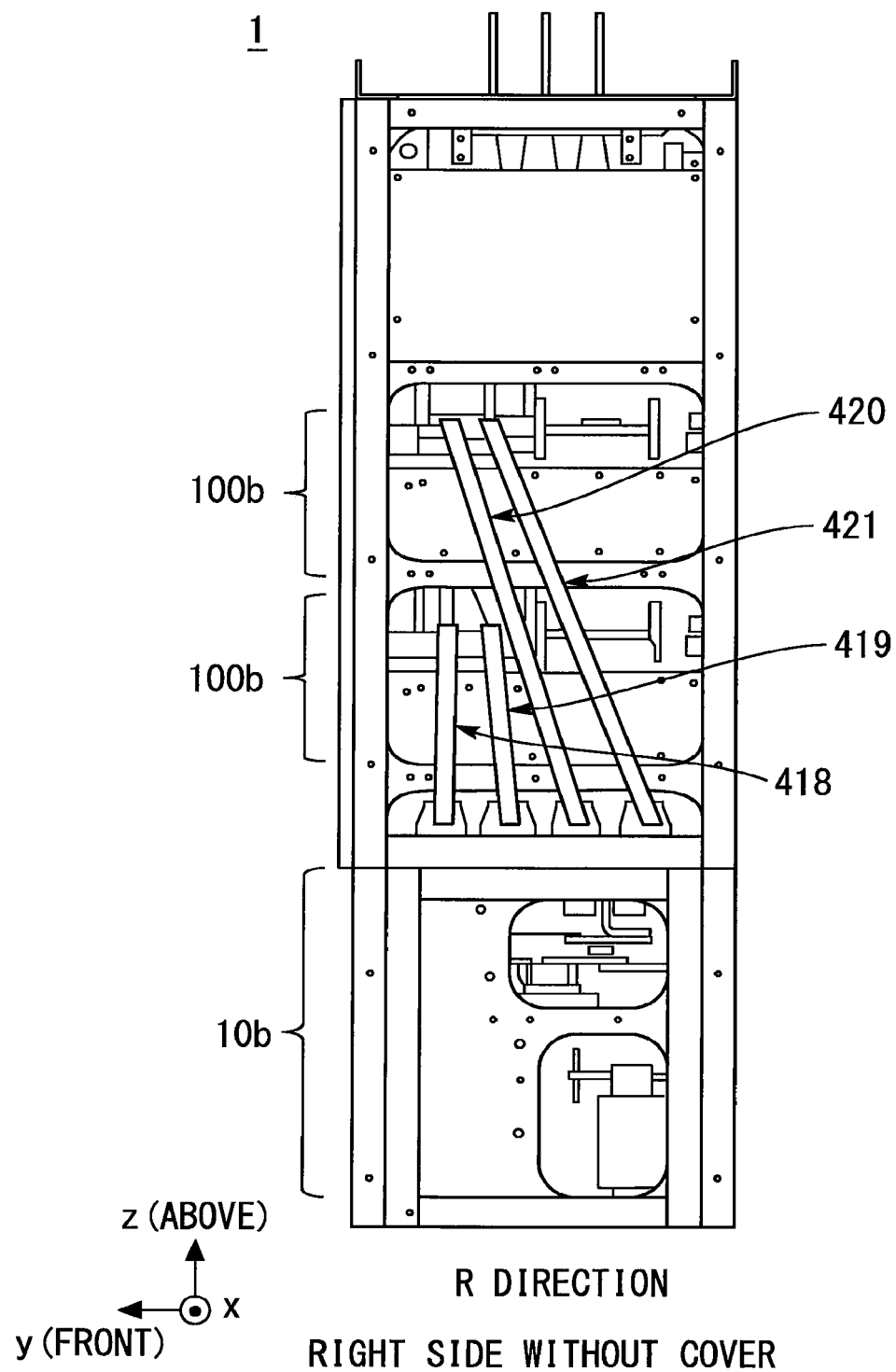
FIG. 28 is a side view of the right side (looking in the R direction) in FIG. 23 of the power conversion device according to the embodiment.

FIG. 28 is a side view of the right side (looking in the R direction) in FIG. 23 of the power conversion device 1 according to the embodiment. FIG. 28 illustrates a state with a side cover removed. In FIG. 28, a plurality of metal bus bars 418, 419, 420, and 421 that connect the second input circuit part 10*b* and the second power conversion units 100*b* are illustrated. The second input circuit part 10*b* is provided with four terminals arranged in a row in the y direction. The plurality of metal bus bars 418 and 419 extending from two terminals of the second input circuit part 10*b* are connected to the lower second power conversion units 100*b*. The plurality of metal bus bars 420 and 421 extending from the other two terminals of the second input circuit part 10*b* are connected to the upper second power conversion units 100*b*.

Figure 29:
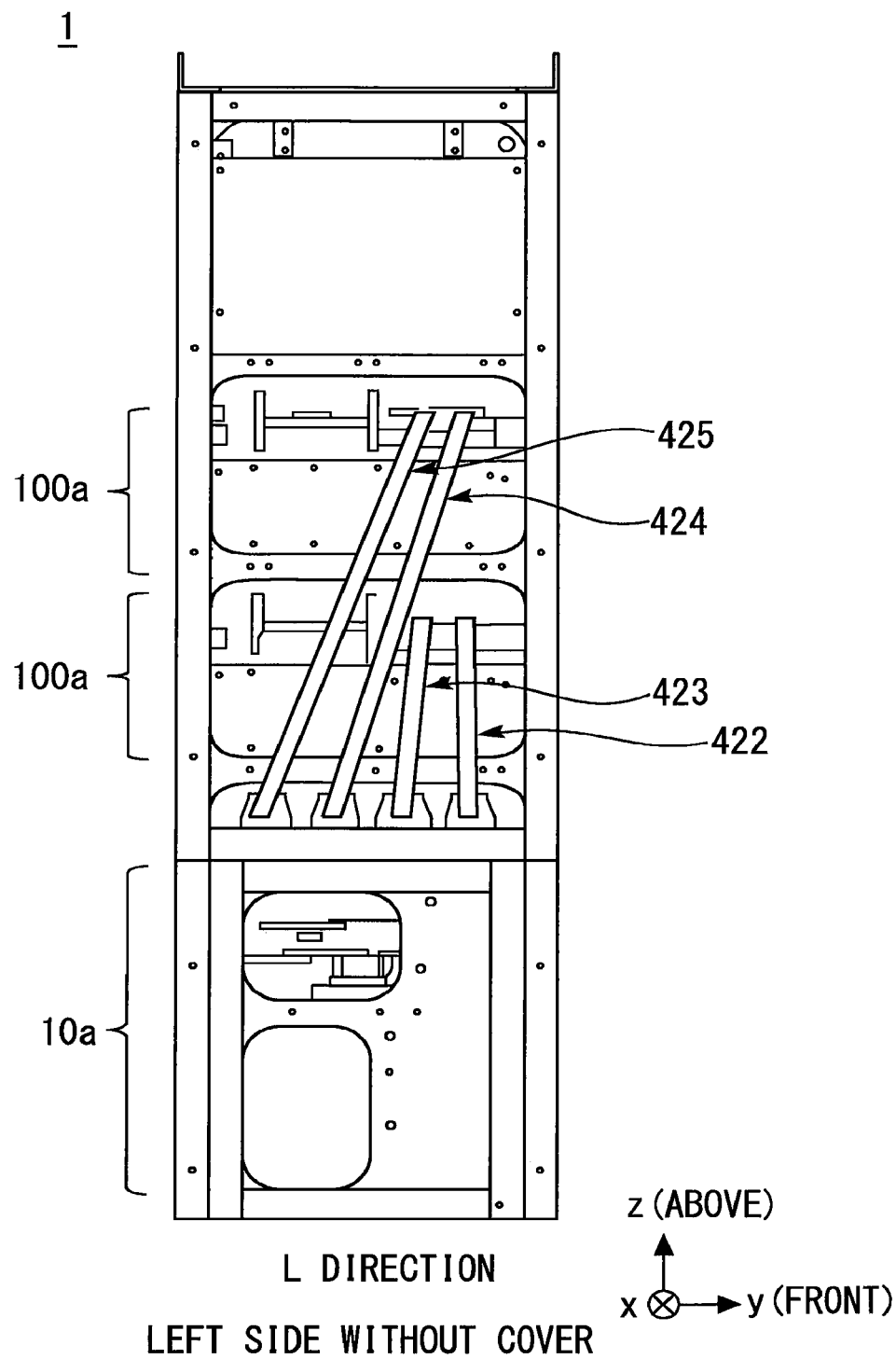
FIG. 29 is a side view of the left side (looking in the L direction) in FIG. 23 of the power conversion device according to the embodiment.

FIG. 29 is a side view of the left side (looking in the L direction) in FIG. 23 of the power conversion device 1 according to the embodiment. FIG. 29 illustrates a state with a side cover removed. In FIG. 29, a plurality of metal bus bars 422, 423, 424, and 425 that connect the first input circuit part 10*a* and the first power conversion units 100*a* are illustrated. The first input circuit part 10*a* is provided with four terminals arranged in a row in the y direction. The plurality of metal bus bars 422 and 423 extending from two terminals of the first input circuit part 10*a* are connected to the lower first power conversion units 100*a*. The plurality of metal bus bars 424 and 425 extending from the other two terminals of the first input circuit part 10*a* are connected to the upper first power conversion units 100*a*.

As FIGS. 28 and 29 demonstrate, the plurality of metal bus bars 420, 421, 424, and 425 that join the upper first power conversion units 100*a* and the upper second power conversion units 100*b* extend obliquely with respect to the z coordinate axis and in straight lines in a plane parallel to the zy plane. Routing the metal bus bars in such diagonal lines makes it possible to form electrical connections over the shortest distance and dramatically reduce the amount of metal bus bar material used.

Note that in the embodiment, the metal bus bars can be categorized as "first metal bus bars", "second metal bus bars", and "third metal bus bars" as follows.

The metal bus bars 403 and 438 to 443 illustrated in FIGS. 24 and 25 are categorized as the "first metal bus bars". Each of the plurality of first metal bus bars has a first end connected to the first input circuit part 10*a* or the second input circuit part 10*b*, a second end connected to the first power conversion units 100*a* or the second power conversion units 100*b*, and a first central part extending straight between the first end and the second end vertically in the back view.

The metal bus bars 426 to 437 illustrated in FIGS. 26 and 27 are categorized as the "second metal bus bars". Each of the plurality of second metal bus bars has a third end connected to the first power conversion units 100*a* or the second power conversion units 100*b*, a fourth end connected to the first reactors 20*a* or the second reactors 20*b*, and a second central part extending straight between the third end and the fourth end vertically in the back view.

The metal bus bars 418 to 425 illustrated in FIGS. 28 and 29 are categorized as the "third metal bus bars". Each of the plurality of third metal bus bars has a fifth end connected to the first reactors 20*a* or the second reactors 20*b*, a sixth end connected to the output circuit part 40, and a third central part extending straight between the fifth end and the sixth end vertically in the back view.

Figure 4:
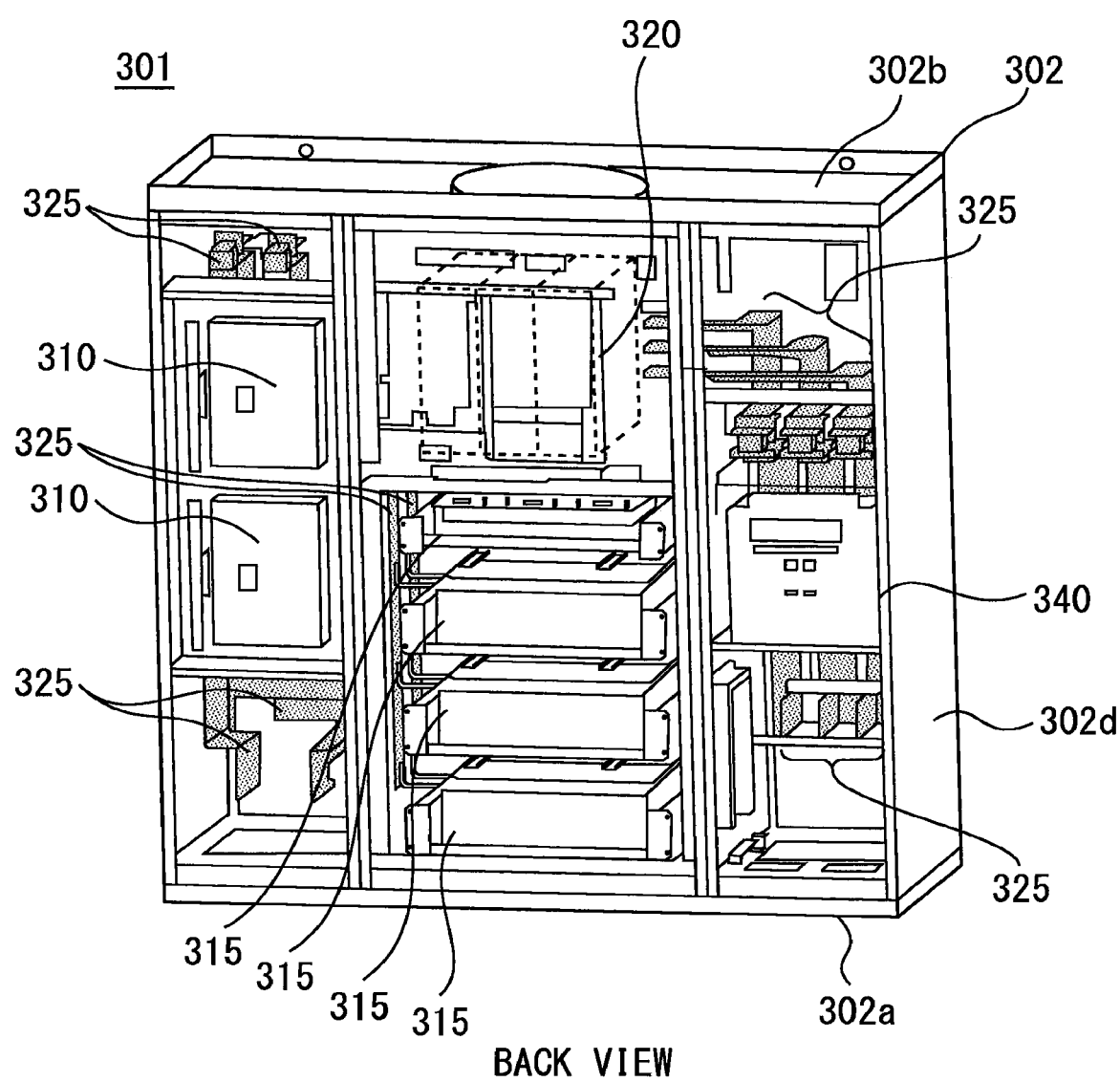
FIG. 4 is a perspective view illustrating the internal structure of a power conversion device according to a comparative example.
Figure 5:
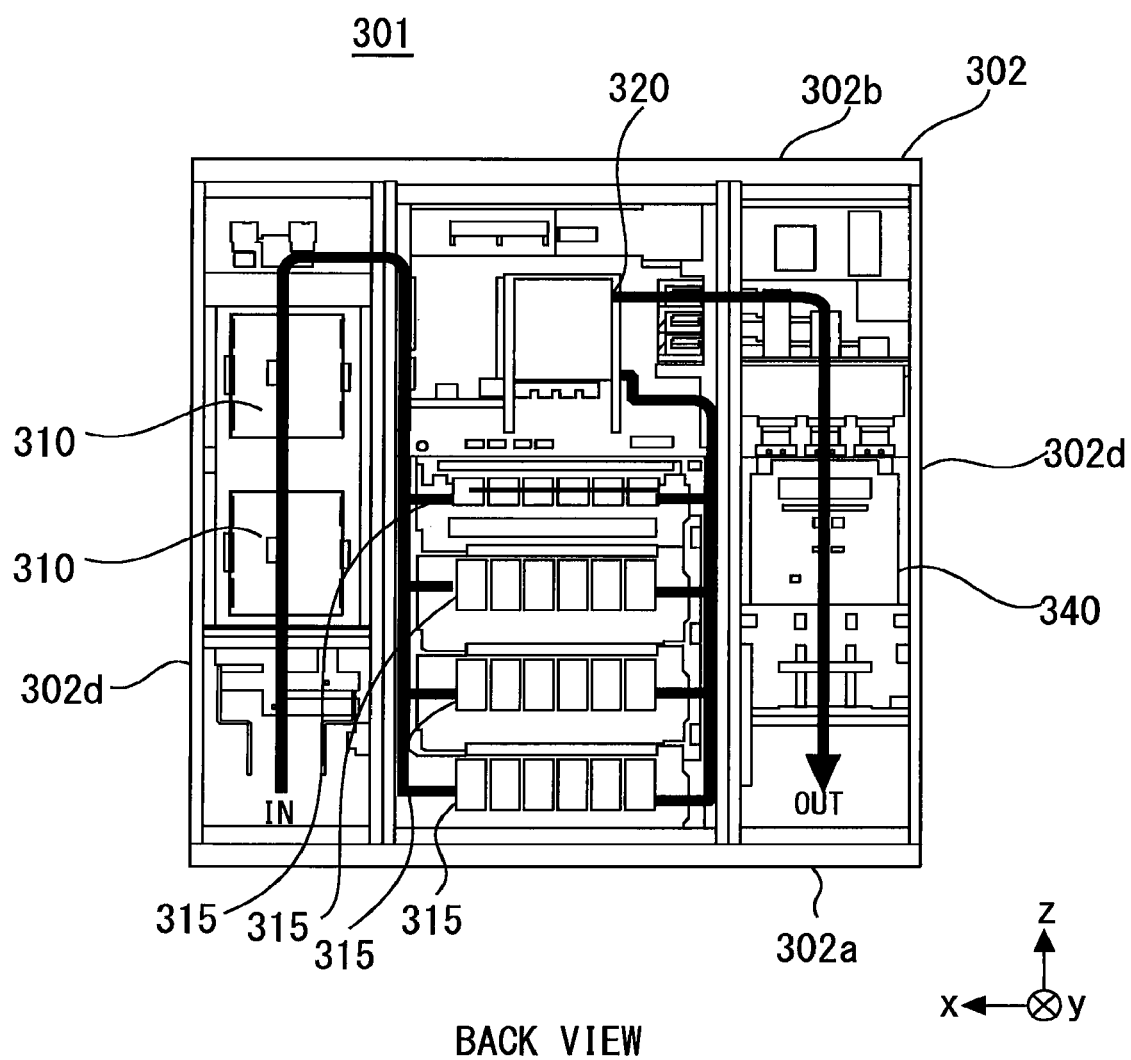
FIG. 5 is a back view illustrating the internal structure of the power conversion device according to a comparative example.

FIG. 4 is a perspective view illustrating the internal structure of a power conversion device 301 according to a comparative example. FIG. 5 is a back view illustrating the internal structure of the power conversion device 301 according to the comparative example. In the power conversion device 301 of the comparative example, a power input terminal IN, a plurality of input breakers 310, power conversion units 315, a reactor 320, an output-side breaker 340, a plurality of metal bus bars 325, and a power output terminal OUT are disposed inside a housing 302 so as not to overlap each other in the back plan view illustrated in FIG. 5. The power input terminal IN, the plurality of input breakers 310, the power conversion units 315, the reactor 320, and the output-side breaker 340 are connected, in this order, in series through the plurality of metal bus bars 325.

In the component layout of the comparative example, as illustrated by the solid bold arrow in FIG. 5, the circuit wiring must make two round trips between a floor 302*a* and a ceiling 302*b*. In other words, the components are laid out such that the circuit wiring makes a round trip in the vertical direction, that is, the z coordinate axis direction. When such a "round-trip component connection method" is implemented, the circuit wiring must be routed to make a round trip vertically through the housing 302. In actuality, it is also necessary to account for the portion of the circuit wiring that extends horizontally, and consequently, with the round-trip component connection method, the circuit wiring length may easily become long enough to be inefficient. This results in a problem, namely that the total length of the metal bus bars 325 is lengthened.

Regarding this point, according to the embodiment, the "one-way component connection method" is adopted as described earlier. Because it is not necessary for the circuit wiring to substantially make a round trip between the floor 2*a* and the ceiling 2*b*, the "one-way component connection method" has the advantage of making it possible to shorten the total wiring length of the series circuits from the first input circuit part 10*a* and the second input circuit part 10*b* to the output terminal 50. Furthermore, because the output terminal 50 is provided in the ceiling 2*b*, and because the transformer 200 provided adjacent to the power conversion device 1 has a transformer input terminal 202 in the upper part thereof, convenience is improved when connecting the output terminal 50 of the power conversion device 1 to the transformer input terminal 202 of the transformer 200.

Figure 30:
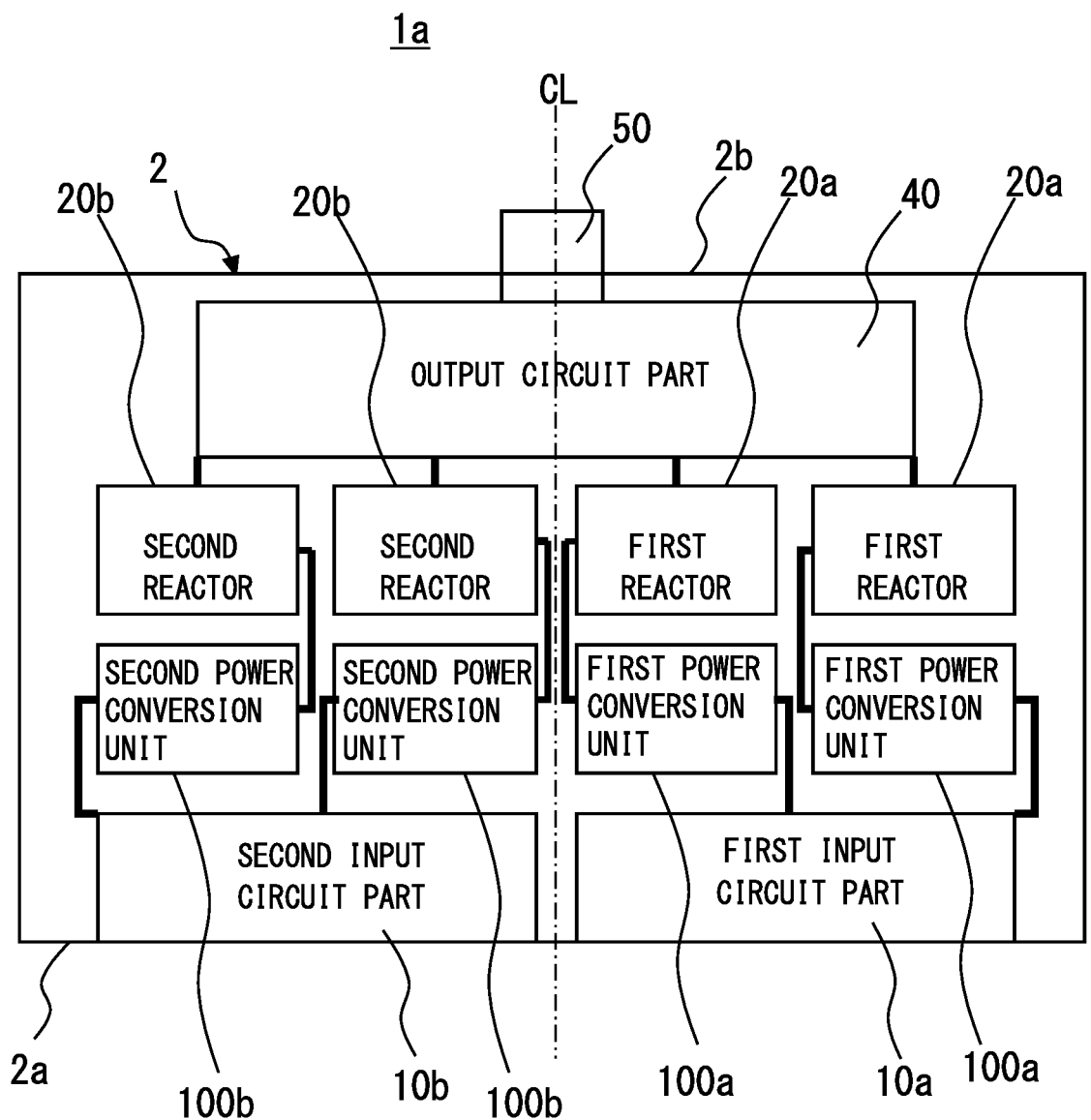
FIG. 30 is a back view illustrating the internal structure of the power conversion device according to a modification of the embodiment.

Note that as a modification of the embodiment, like a power conversion device 1*a* illustrated in FIG. 30, the first reactors 20*a* and the second reactors 20*b* may also be provided above the first power conversion units 100*a* and the second power conversion units 100*b*. In FIG. 30, the bold lines joining the components schematically illustrate metal bus bars. In FIG. 30, similarly to the embodiment, each of the plurality of metal bus bars extends vertically in the plan view of FIG. 30, or in other words straight and parallel with the z coordinate axis. In this modification, the "one-way component connection method" is achieved similarly to the embodiment.

As another modification of the embodiment, the embodiment may be modified such that the "left-side series circuit" and the "right-side series circuit" are not line-symmetric about the reference axis CL. For example, the component layout of the left-side series circuit may retain the layout of the embodiment described with reference to diagrams such as FIGS. 2, 3, and 23, while the component layout of the right-side series circuit may be modified like the modification illustrated in FIG. 30. Even if such an asymmetrical arrangement is adopted, by applying the "one-way component connection method" to each of the "left-side series circuit" and the "right-side series circuit", various effects such as shortening the circuit wiring length similar to the embodiment can be obtained.

Note that as a modification of the embodiment, in the power conversion device 1, the position of the first reactors 20a and the position of the first power conversion units 100a may be interchanged, and the position of the second reactors 20b and the position of the second power conversion units 100b may be interchanged. In this case, the first reactors 20a and the second reactors 20b are disposed at either horizontal end of the housing 2, while the first power conversion units 100a and the second power conversion units 100b are interposed in between.

Also, as a modification of the embodiment, one of the "left-side series circuit" and the "right-side series circuit" described above may be omitted. Even with such an omission, various effects such as shortening the circuit wiring length according to the "one-way component connection method" can be obtained. With this arrangement, a compact power conversion device having half the volume of the power conversion device 1 according to the embodiment is provided.

Embodiment of Power Conversion Unit

Figure 6:
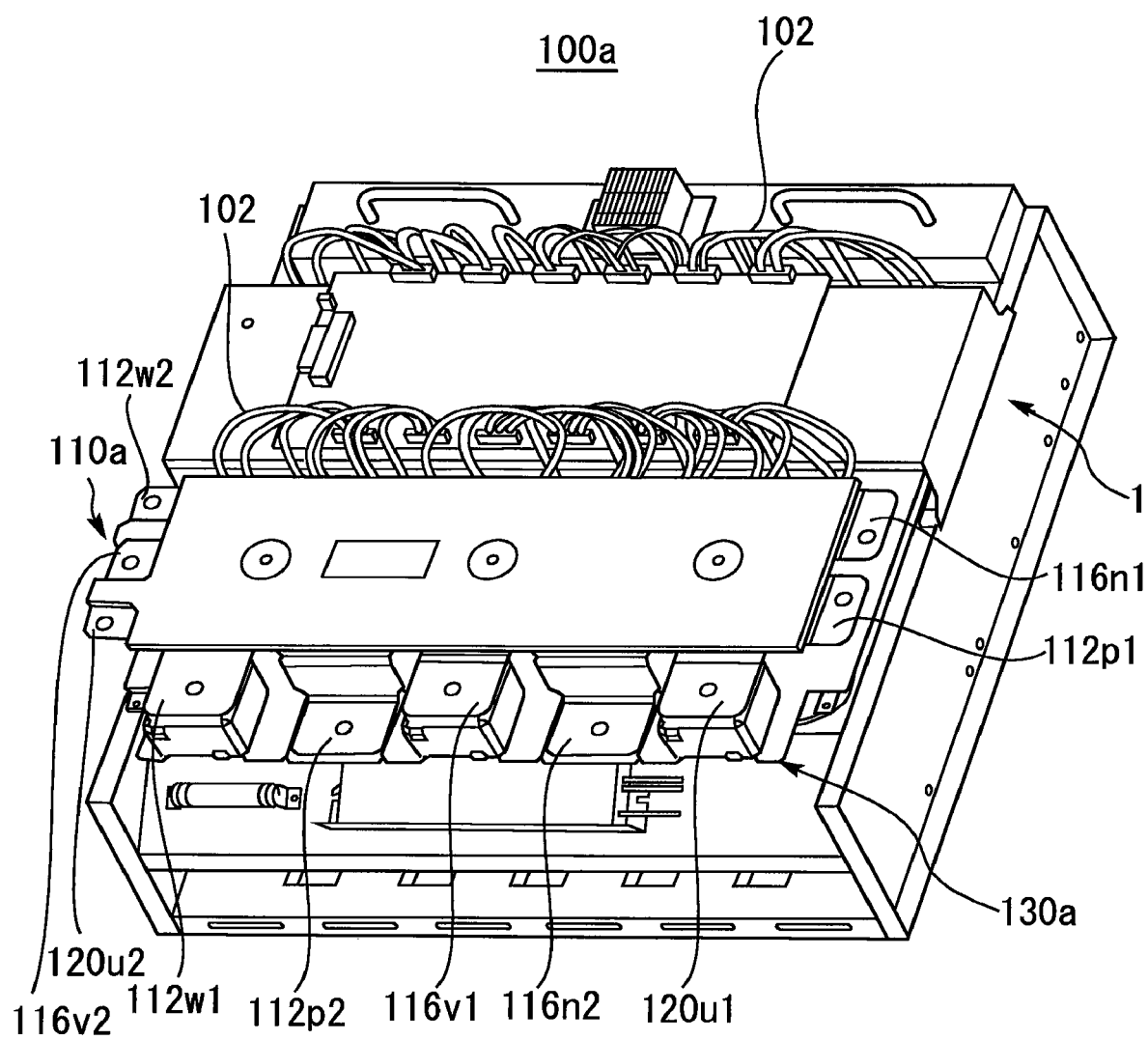
FIG. 6 is a perspective view illustrating the external appearance of a first power conversion unit according to the embodiment.
Figure 7:
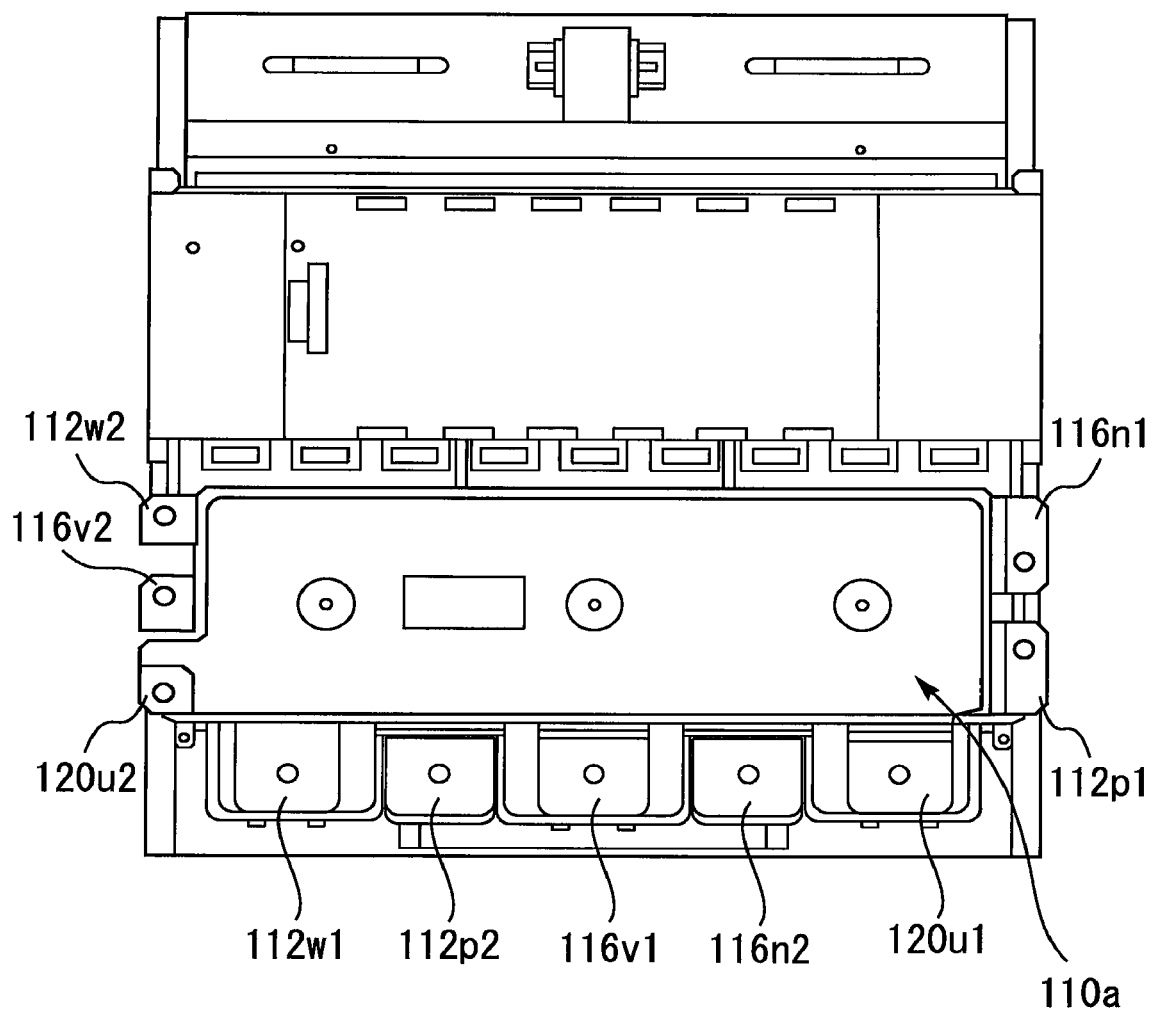
FIG. 7 is a top view illustrating the external appearance of a first power conversion unit according to the embodiment.
Figure 8:
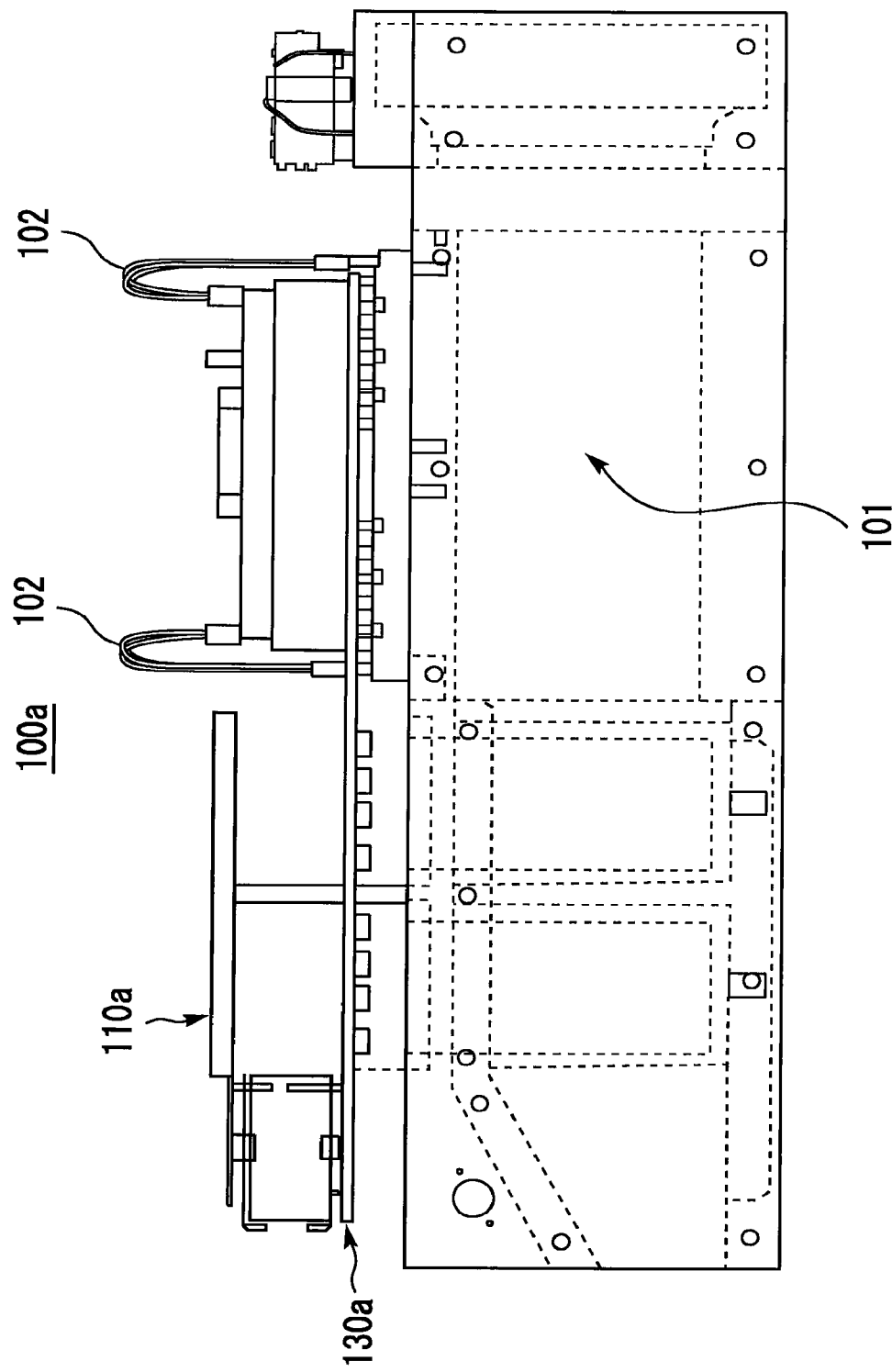
FIG. 8 is a side view illustrating the external appearance of the first power conversion unit according to the embodiment.

FIG. 6 is a perspective view illustrating the external appearance of one of the first power conversion units 100a according to the embodiment. FIG. 7 is a top view illustrating the external appearance of one of the first power conversion units 100a according to the embodiment. FIG. 8 is a side view illustrating the external appearance of one of the first power conversion units 100a according to the embodiment. As illustrated in FIGS. 6 to 8, each first power conversion unit 100a is provided with a power conversion module 101 that converts between direct-current (DC) and alternating-current (AC) power, a first upper laminate bus bar 110a, a plurality of wires 102, and a first lower laminate bus bar 130a. The power conversion module 101 includes an internal power semiconductor device such as an IGBT or a MOSFET. In the embodiment, each first power conversion unit 100a is provided with a three-phase inverter circuit that converts DC power to three-phase AC power.

Figure 9:
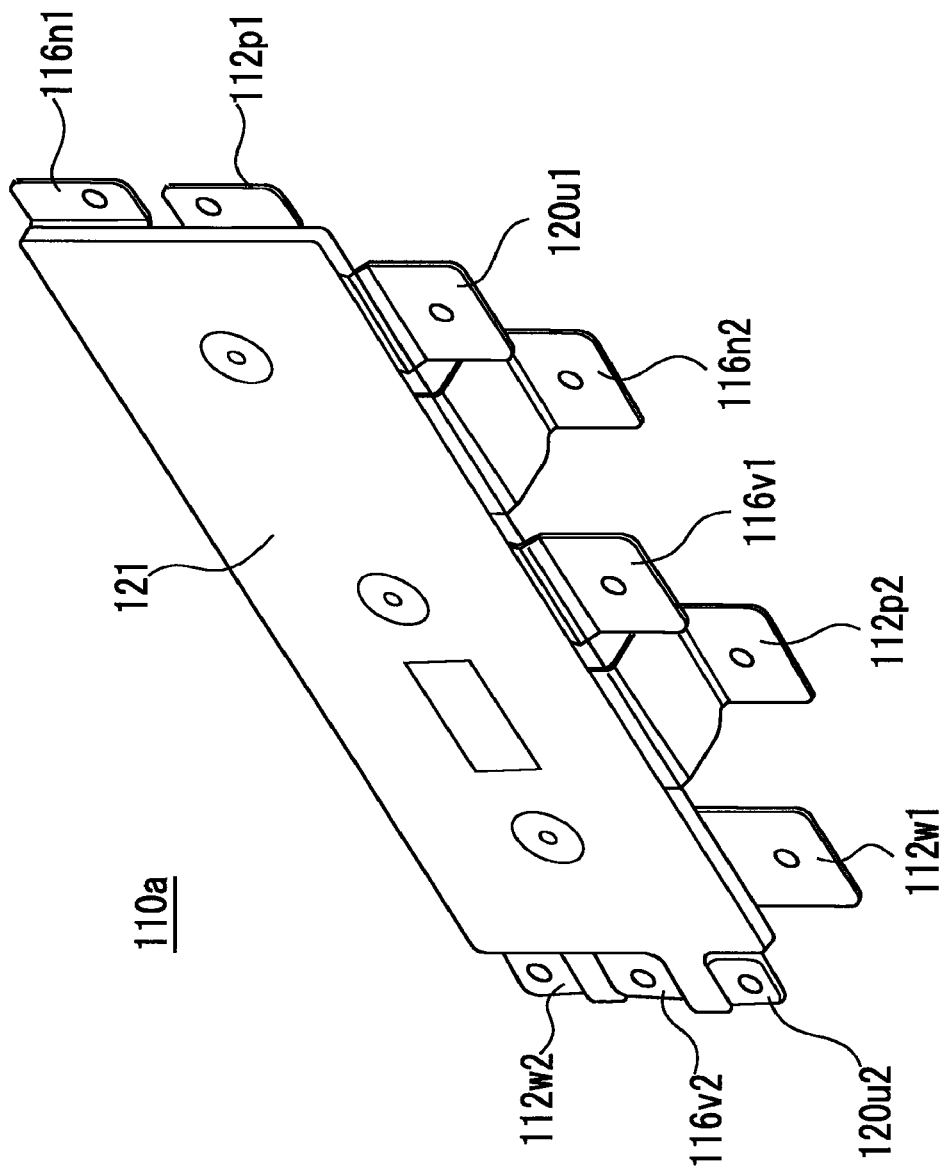
FIG. 9 is a perspective view of a first upper laminate bus bar included in the first power conversion unit according to the embodiment.
Figure 10:
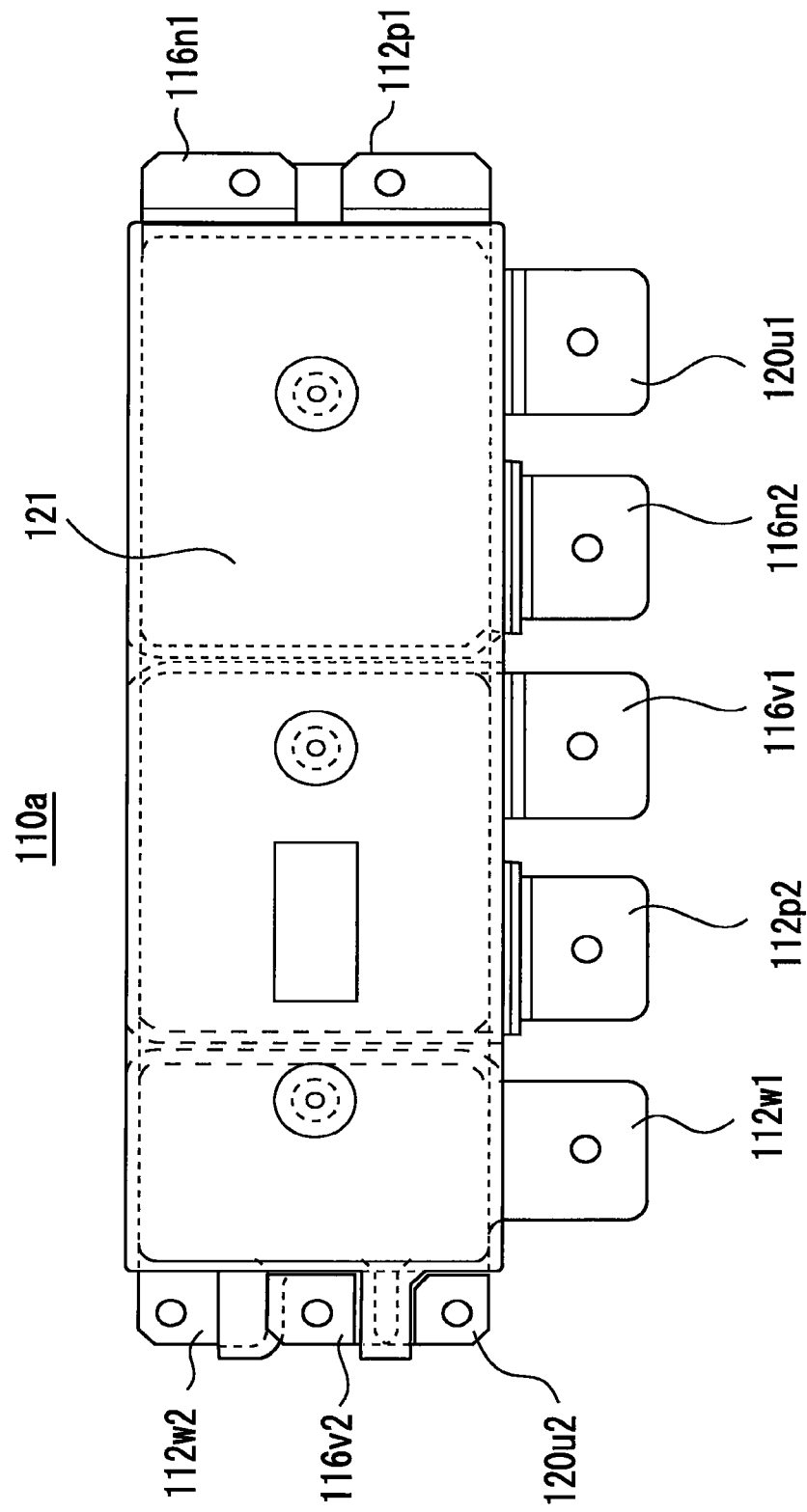
FIG. 10 is a top view of the first upper laminate bus bar included in the first power conversion unit according to the embodiment.
Figure 11:
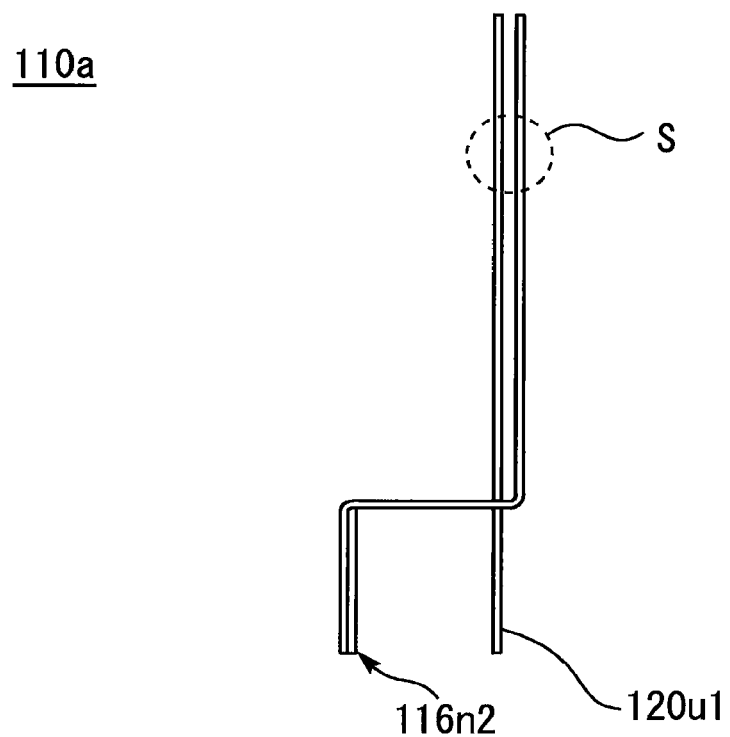
FIG. 11 is a side view of the first upper laminate bus bar included in the first power conversion unit according to the embodiment.

FIG. 9 is a perspective view of the first upper laminate bus bar 110a included in one of the first power conversion units 100a according to the embodiment. FIG. 10 is a top view of the first upper laminate bus bar 110a included in one of the first power conversion units 100a according to the embodiment. FIG. 11 is a side view of the first upper laminate bus bar 110a included in one of the first power conversion units 100a according to the embodiment. The first upper laminate bus bar 110a is provided with a positive DC input terminal 112p1, a negative DC input terminal 116n1, a positive DC intermediary terminal 112p2, a negative DC intermediary terminal 116n2, a first phase AC intermediary terminal 120u1, a second phase AC intermediary terminal 116v1, a third phase AC intermediary terminal 112w1, a first phase AC output terminal 120u2, a second phase AC output terminal 116v2, and a third phase AC output terminal 112w2.

It is assumed that the first phase is the U phase, the second phase is the V phase, and the third phase is the W phase.

DC power is input into the positive DC input terminal 112p1. The negative DC input terminal 116n1 is connected to a reference potential. The positive DC intermediary terminal 112p2 and the negative DC intermediary terminal 116n2 are terminals for transmitting DC power to the power conversion module 101 through the first lower laminate bus bar 130a. The first phase AC intermediary terminal 120u1, the second phase AC intermediary terminal 116v1, and the third phase AC intermediary terminal 112w1 receive three-phase AC power from the power conversion module 101. The three-phase AC power (UV W) received by the first phase AC intermediary terminal 120u1 to the third phase AC intermediary terminal 112w1 is output from the first phase AC output terminal 120u2, the second phase AC output terminal 116v2, and the third phase AC output terminal 112w2.

Specifically, in the embodiment, the intermediary terminals are deliberately arranged to alternate between DC and AC, as illustrated in FIGS. 9 and 10. As the plan view in FIG. 10 clearly demonstrates, the third phase AC intermediary terminal 112w1, the positive DC intermediary terminal 112p2, the second phase AC intermediary terminal 116v1, the negative DC intermediary terminal 116n2, and the first phase AC intermediary terminal 120u1 are arranged in this order in a row on one edge of the rectangular periphery of the first upper laminate bus bar 110a.

However, as the perspective view in FIG. 9 demonstrates, the positive DC intermediary terminal 112p2 and the negative DC intermediary terminal 116n2 are shifted in the thickness direction of the first upper laminate bus bar 110a with respect to components such as the first phase AC intermediary terminal 120u1. The ends of the positive DC intermediary terminal 112p2 and the negative DC intermediary terminal 116n2 extend toward the back of the first upper laminate bus bar 110a to form bent L-shaped terminals. Specifically, each bent L-shaped terminal includes an extending part that extends toward the back of the first upper laminate bus bar 110a, and a front end part that is bent at a right angle from the extending part to form a face parallel to components such as the first phase AC intermediary terminal 120u1.

Figure 12:
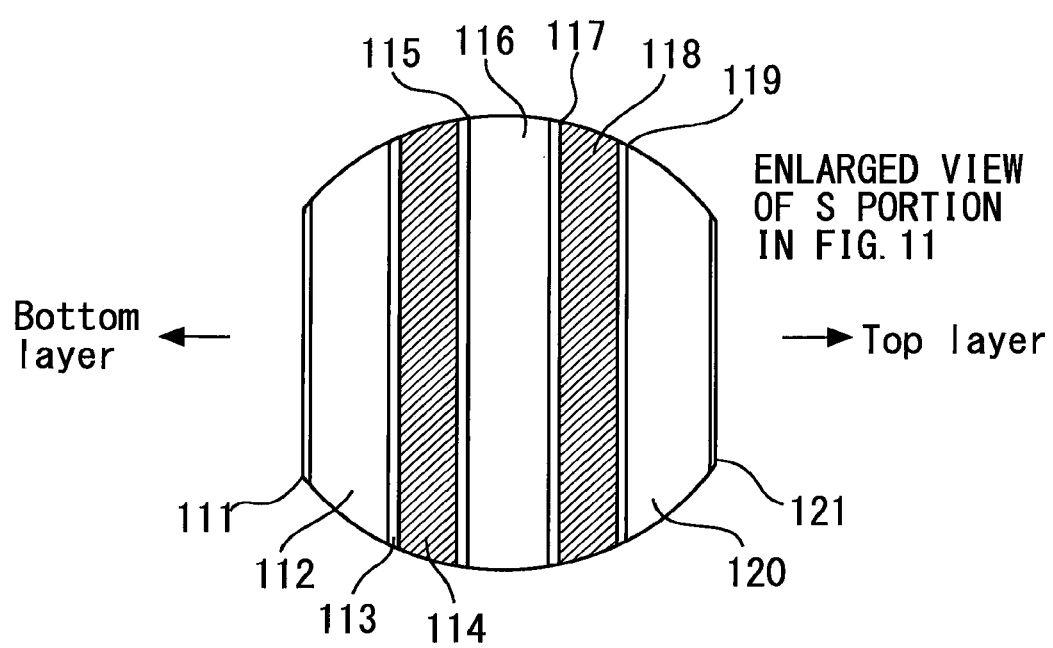
FIG. 12 is an enlarged view illustrating the laminated structure of the first upper laminate bus bar included in the first power conversion unit according to the embodiment.
Figure 13:
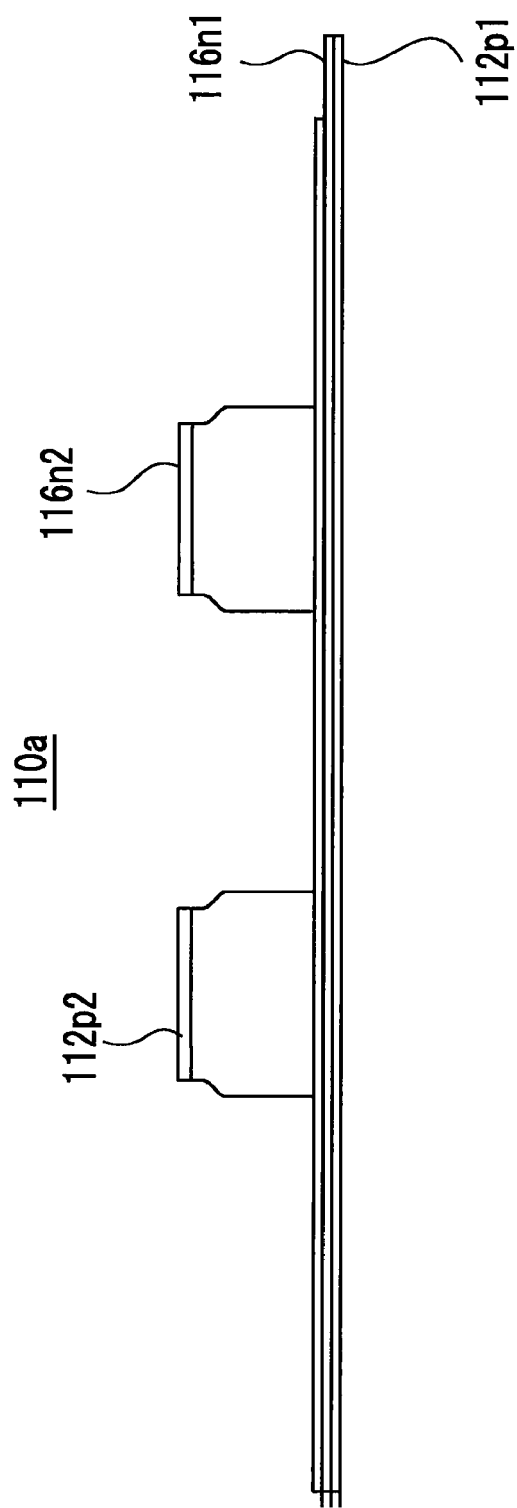
FIG. 13 is a back view of the first upper laminate bus bar included in the first power conversion unit according to the embodiment.

FIG. 12 is an enlarged view illustrating the laminated structure of the first upper laminate bus bar 110a included in one of the first power conversion units 100a according to the embodiment. FIG. 12 is an enlarged view of the area inside the dashed frame S in FIG. 11. FIG. 13 is a back view of the first upper laminate bus bar 110a included in one of the first power conversion units 100a according to the embodiment. The arrow labeled "Bottom layer" in FIG. 12 points toward the bottom of the first power conversion unit 100a. The arrow labeled "Top layer" in FIG. 12 points toward the top of the first power conversion unit 100a.

As illustrated in FIG. 12, the first upper laminate bus bar 110a is a laminate of, in the following order, an insulating sheet 111, a first conductive layer 112, an insulating sheet 113, an insulating plate 114, an insulating sheet 115, a second conductive layer 116, an insulating sheet 117, an insulating plate 118, an insulating sheet 119, a third conductive layer 120, and an insulating sheet 121. The first conductive layer 112 to the third conductive layer 120 each include one or more metal plates. In the embodiment, the metal plates forming the first conductive layer 112 to the third conductive layer 120 are all assumed to be copper (Cu).

Figure 14:
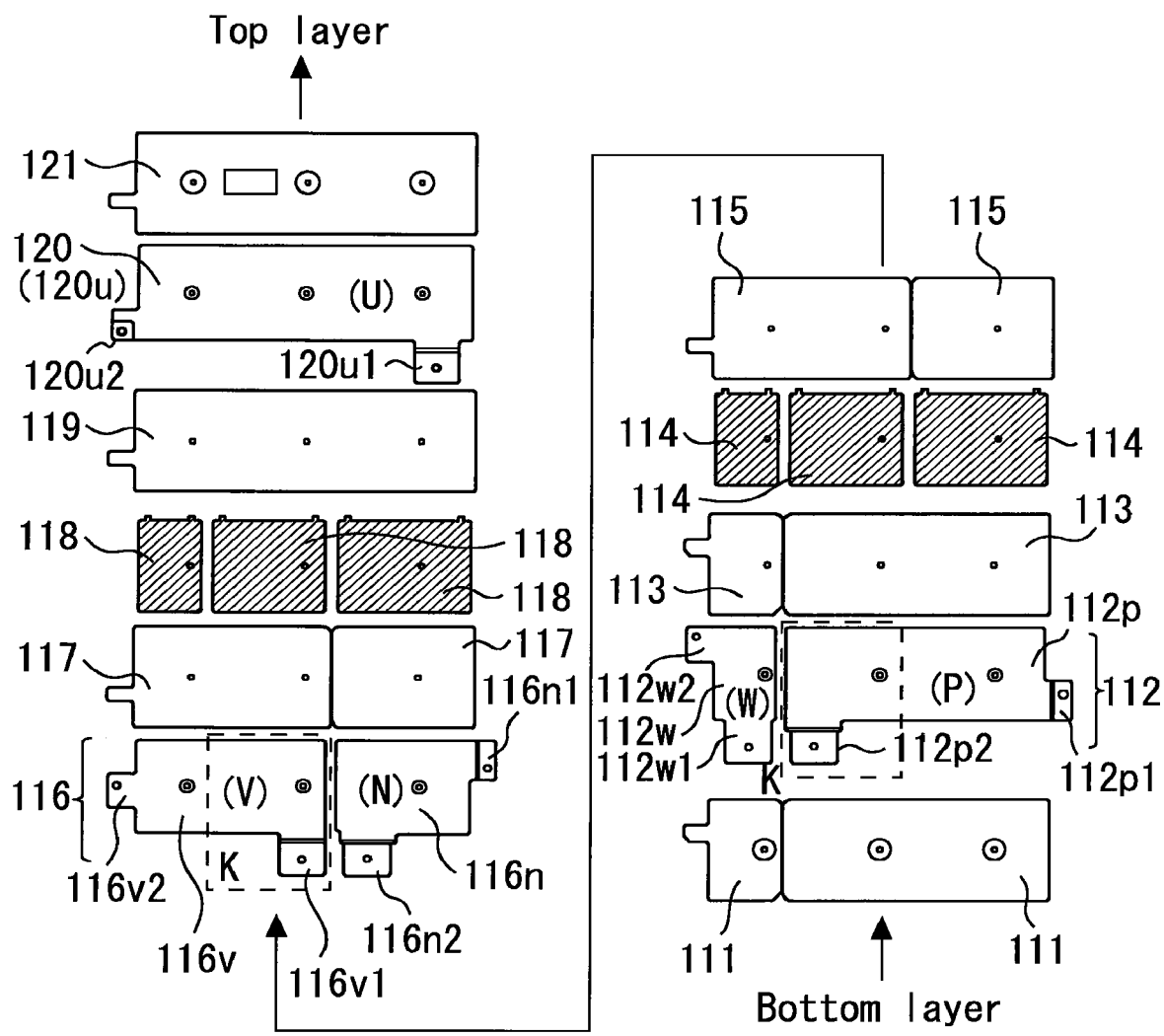
FIG. 14 is an exploded view of the first upper laminate bus bar included in the first power conversion unit according to the embodiment.

FIG. 14 is an exploded view of the first upper laminate bus bar 110a included in one of the first power conversion units 100a according to the embodiment. The first conductive layer 112 includes a first DC conductive plate 112p that handles positive direct current and a first AC conductive plate 112w that handles third phase alternating current, that is, W phase alternating current. The first DC conductive plate 112p includes the positive DC input terminal 112p1 as a protruding part provided in a first peripheral area. The first DC conductive plate 112p includes the positive DC intermediary terminal 112p2 as a protruding part provided in a second peripheral area different from the first peripheral area.

The first AC conductive plate 112w is provided horizontally adjacent to the first DC conductive plate 112p with a gap in between. The first AC conductive plate 112w includes the third phase AC output terminal 112w2 as a protruding part provided in a third peripheral area facing away from the first peripheral area. The first AC conductive plate 112w includes the third phase AC intermediary terminal 112w1 as a protruding part provided in a fourth peripheral area facing in the same direction as the second peripheral area.

The "second conductive layer 116" includes a second DC conductive plate 116n that handles negative direct current and a second AC conductive plate 116v that handles second phase alternating current, that is, V phase alternating current. The second DC conductive plate 116n is stacked on top of the first DC conductive plate 112p with the insulating plate 114 and the like in between. The outline in the planar direction of the second DC conductive plate 116n is smaller than the first DC conductive plate 112p. The second DC conductive plate 116n includes the negative DC input terminal 116n1 as a protruding part provided in a fifth peripheral area facing in the same direction as the first peripheral area. The second DC conductive plate 116n includes the negative DC intermediary terminal 116n2 as a protruding part provided in a sixth peripheral area facing in the same direction as the second peripheral area.

The second AC conductive plate 116v is stacked onto the first AC conductive plate 112w with the insulating plate 114 in between. The second AC conductive plate 116v is provided horizontally adjacent to the second DC conductive plate 116n with a gap in between. The portion near the second DC conductive plate 116n in the second AC conductive plate 116v overlaps with a portion of the first DC conductive plate 112p through the insulating plate 114. The second AC conductive plate 116v includes the second phase AC output terminal 116v2 as a protruding part provided in a seventh peripheral area facing in the same direction as the third peripheral area. The second AC conductive plate 116v includes the second phase AC intermediary terminal 116v1 as a protruding part provided in an eighth peripheral area facing in the same direction as the second peripheral area.

The "third conductive layer 120" includes a third AC conductive plate 120u that handles first phase alternating current, that is, U phase alternating current. The third AC conductive plate 120u is stacked on top of both the second DC conductive plate 116n and the second AC conductive plate 116v with the insulating plate 118 and the like in between. The third AC conductive plate 120u includes the first phase AC intermediary terminal 120u1 as a protruding part provided in a tenth peripheral area facing in the same direction as the second peripheral area. The third AC conductive plate 120u includes the first phase AC output terminal 120u2 as a protruding part provided in a ninth peripheral area facing in the same direction as the third peripheral area.

According to the embodiment, as illustrated in FIG. 14, it is possible to create an "overlap K" between the first DC conductive plate 112p and the second AC conductive plate 116v. By providing the "overlap K", the dimension in the planar direction of the first upper laminate bus bar 110a can be reduced compared to a laminate bus bar structure in which the DC side and the AC side are completely isolated in the planar direction. With this arrangement, the first power conversion units 100a can be made more compact overall. Also, the first upper laminate bus bar 110a has a laminated structure obtained by laminating a plurality of plate-like flat bodies. By taking such a laminated structure, sufficient rigidity can be imparted to the first upper laminate bus bar 110a even if a reinforcing member is omitted.

Figure 15:
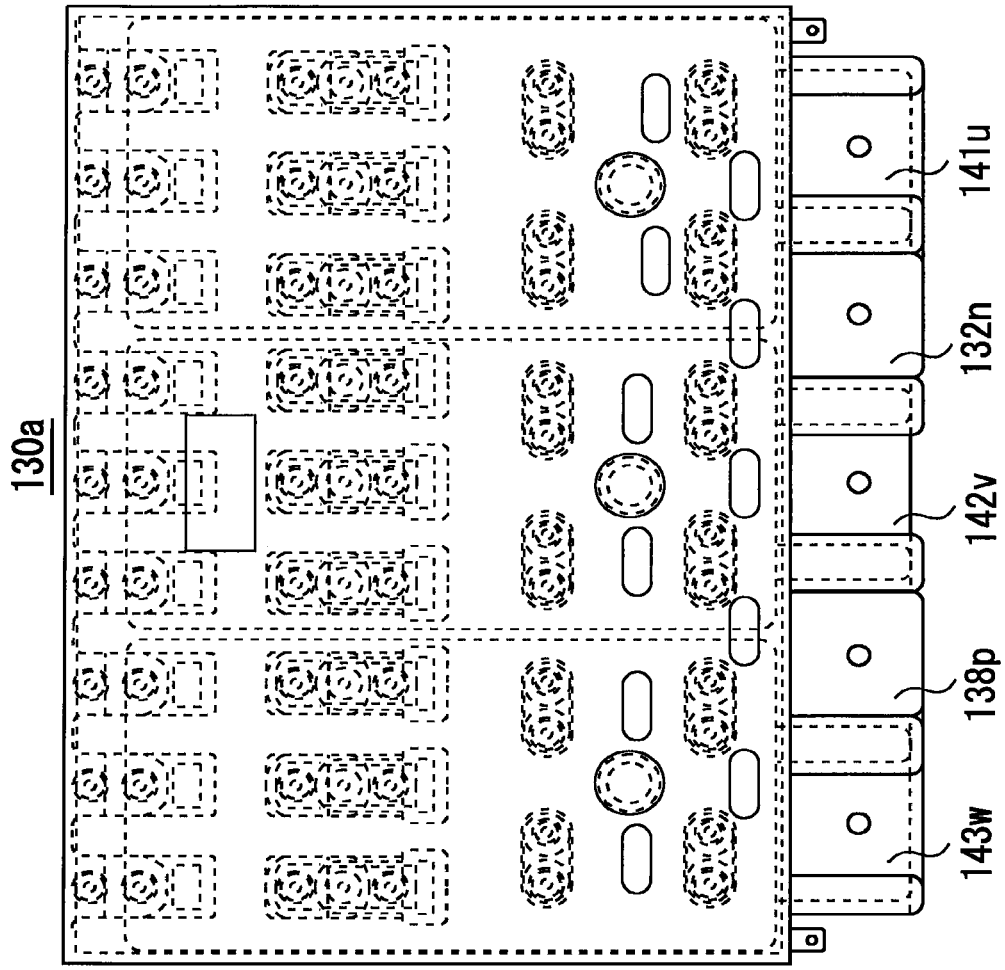
FIG. 15 is a top view of a first lower laminate bus bar included in the first power conversion unit according to the embodiment.

FIG. 15 is a top view of the first lower laminate bus bar 130a included in one of the first power conversion units 100a according to the embodiment. Lower intermediary terminals 143w, 138p, 142v, 132n, and 141u are arranged in this order in a row such that the row of the third phase AC intermediary terminal 112w1, the positive DC intermediary terminal 112p2, the second phase AC intermediary terminal 116v1, the negative DC intermediary terminal 116n2, and the first phase AC intermediary terminal 120u1 described with reference to FIG. 10 are aligned with the DC polarity and the three AC phases in a plan view.

Figure 16:
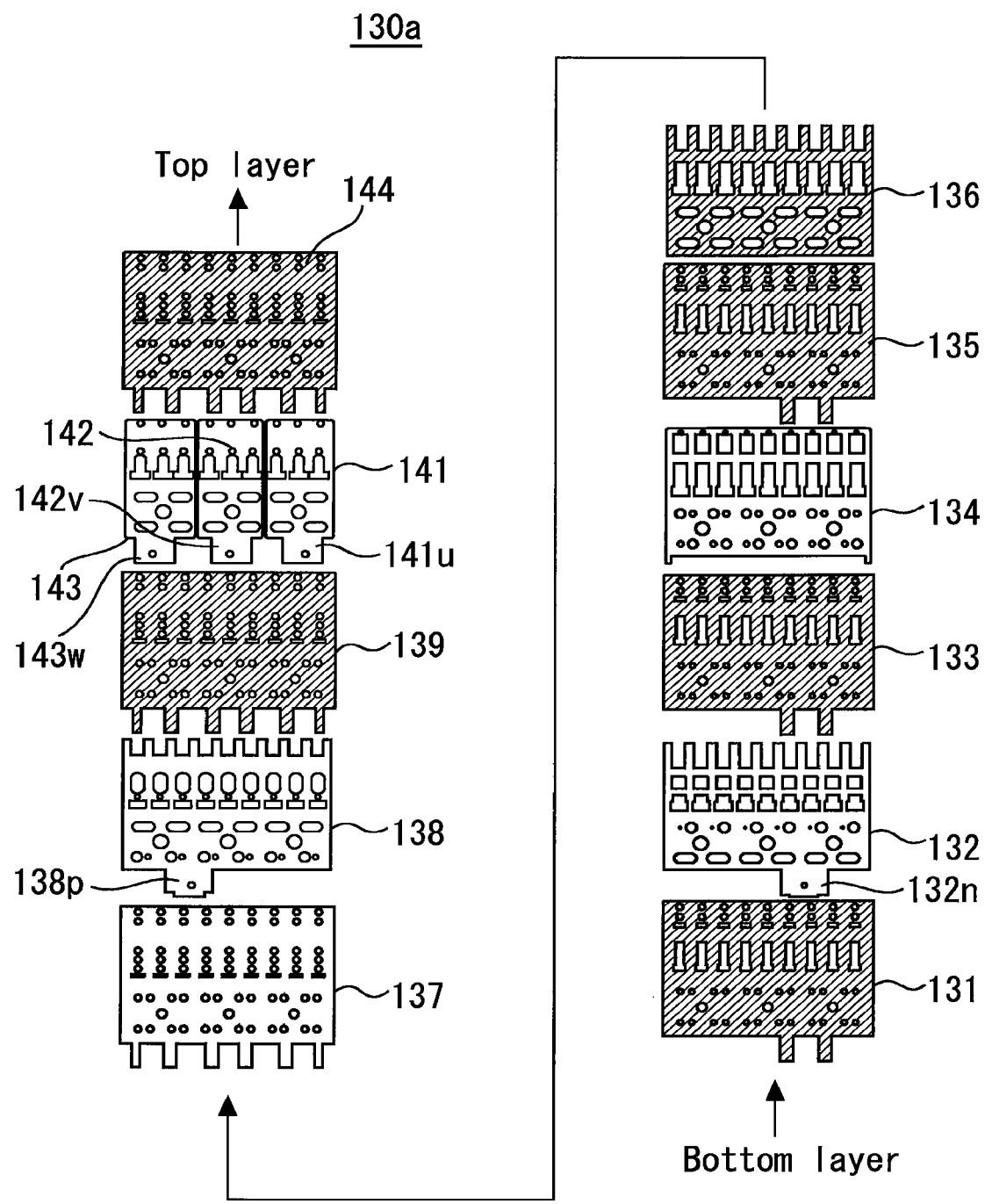
FIG. 16 is an exploded view of the first lower laminate bus bar included in the first power conversion unit according to the embodiment.
Figure 17:
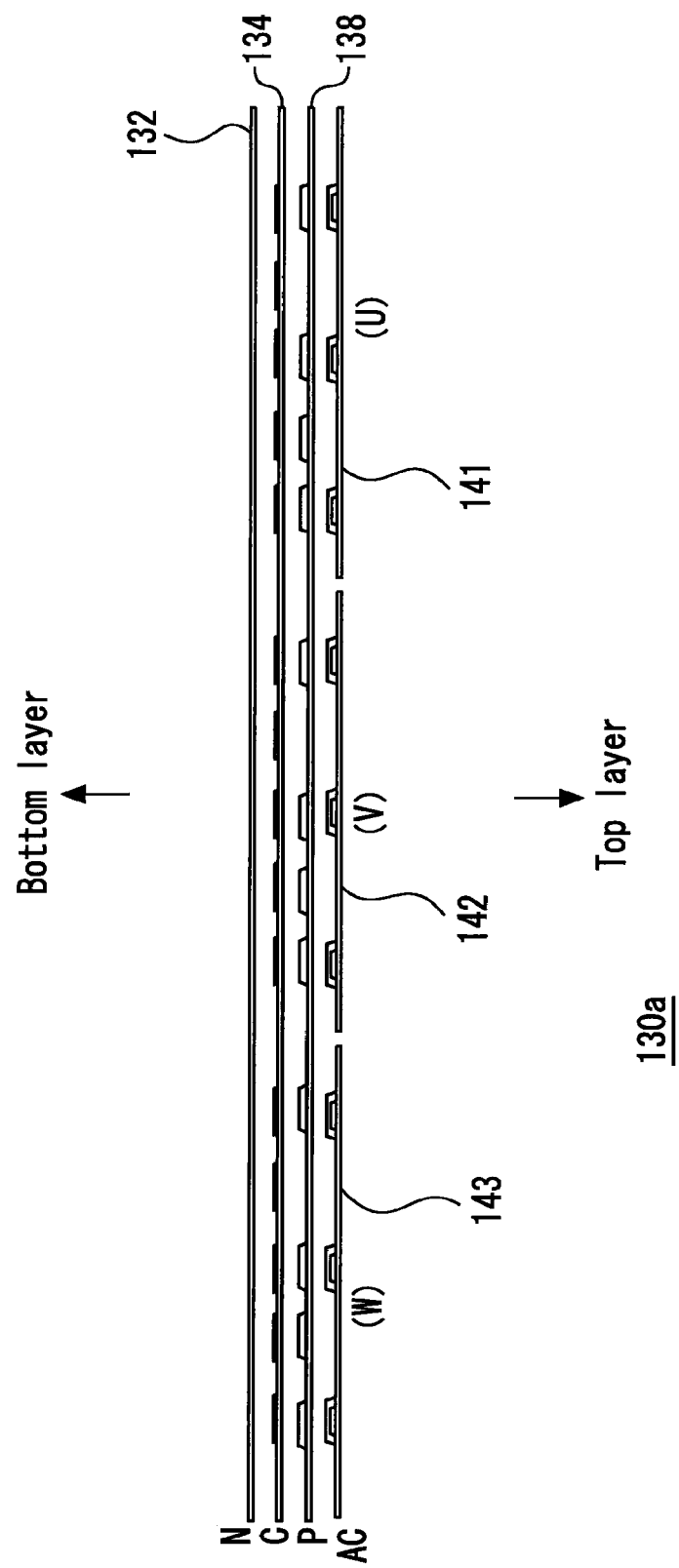
FIG. 17 is a schematic back view of the first lower laminate bus bar included in the first power conversion unit according to the embodiment.

FIG. 16 is an exploded view of the first lower laminate bus bar 130a included in one of the first power conversion units 100a according to the embodiment. The first lower laminate bus bar 130a is a laminate of, in the following order, an insulating sheet 131, a negative DC lower conductive plate 132, an insulating sheet 133, a conductive plate 134 that handles the C phase, insulating sheets 135, 136, and 137, a positive DC lower conductive plate 138, an insulating sheet 139, AC lower conductive plates 141, 142, and 143 arranged in the planar direction, and an insulating sheet 144. By taking such a laminated structure, sufficient rigidity can be imparted to the first lower laminate bus bar 130a even if a reinforcing member is omitted. FIG. 17 is a schematic back view of the first lower laminate bus bar 130a included in one of the first power conversion units 100a according to the embodiment. For convenience, the insulating sheets 131 to 144 are omitted from illustration.

Figure 18:
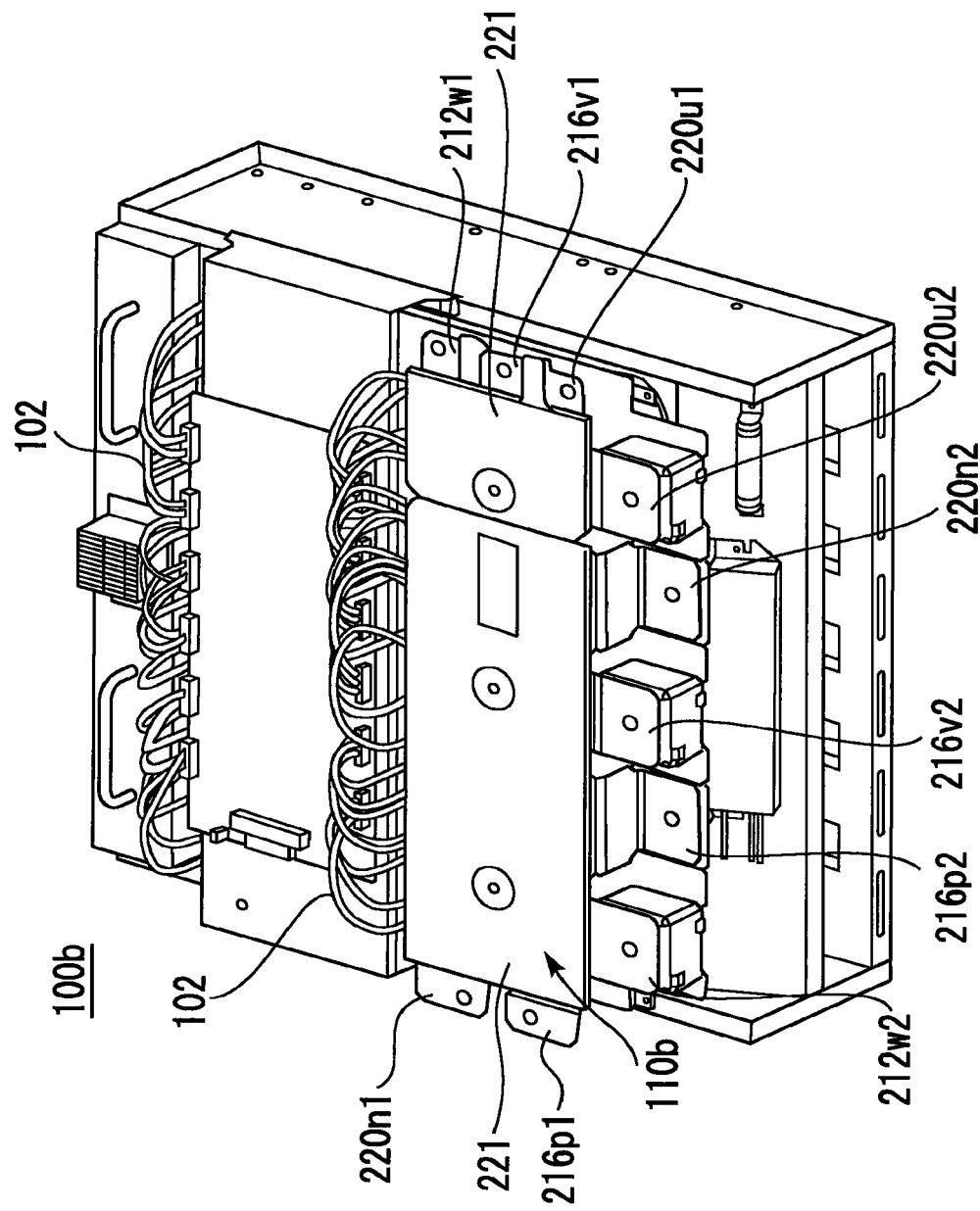
FIG. 18 is a perspective view illustrating the external appearance of a second power conversion unit according to the embodiment.

FIG. 18 is a perspective view illustrating the external appearance of one of the second power conversion units 100b according to the embodiment. The second power conversion units 100b are provided with a structure resembling that of the first power conversion units 100a. However, on characteristic difference is that a second upper laminate bus bar 110b included in each second power conversion unit 100b is provided with a structure that is substantially symmetrical in a plan view to the first upper laminate bus bar 110a described earlier. With this arrangement, direct current can be input from the opposite direction of the first power conversion units 100a, and alternating current can be output in the opposite direction of the first power conversion units 100a. By using the first power conversion units 100a and the second power conversion units 100b, guiding the circuit wiring from either end of the housing 2 to the center becomes trivial. Being able to achieve the "line-symmetric component arrangement" described in the embodiment easily is also an advantage.

Figure 19:
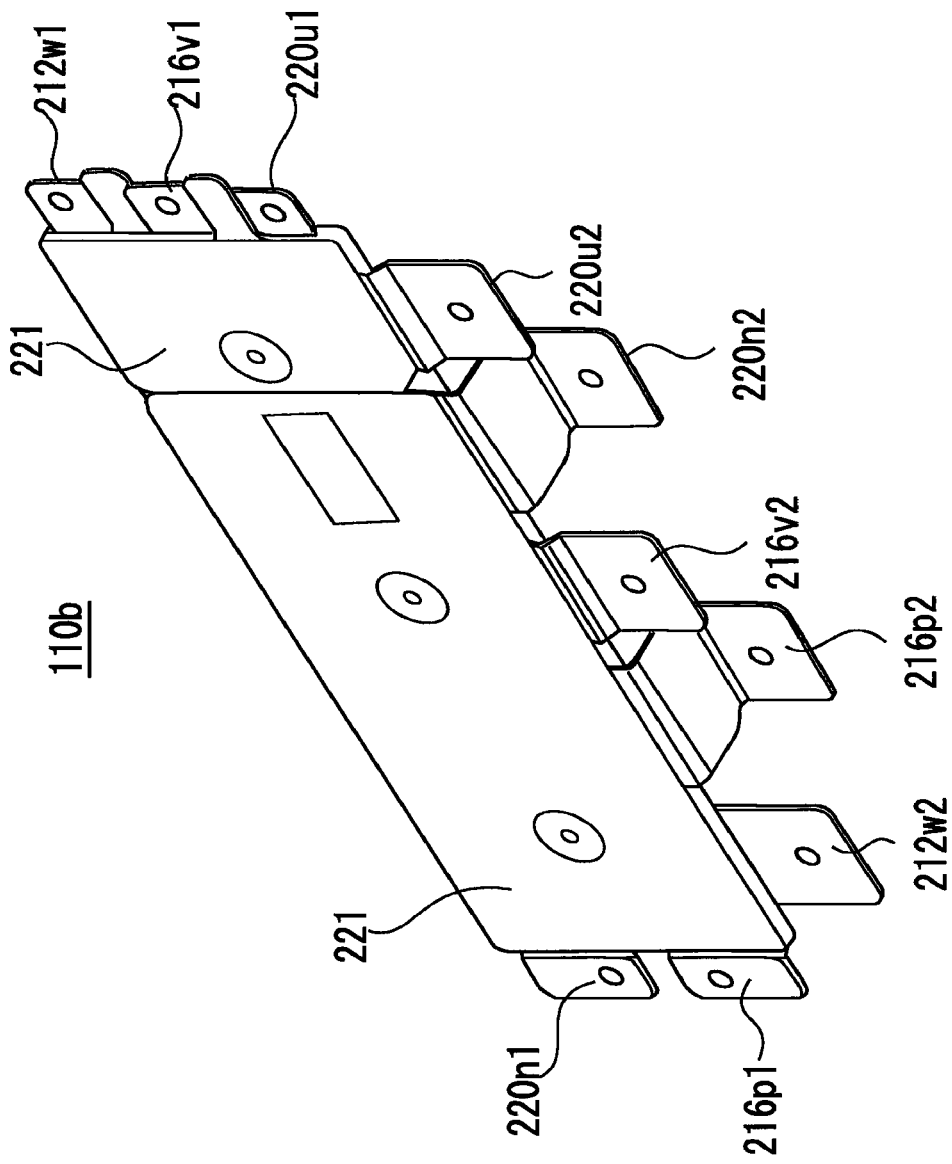
FIG. 19 is a perspective view of a second upper laminate bus bar included in the second power conversion unit according to the embodiment.
Figure 20:
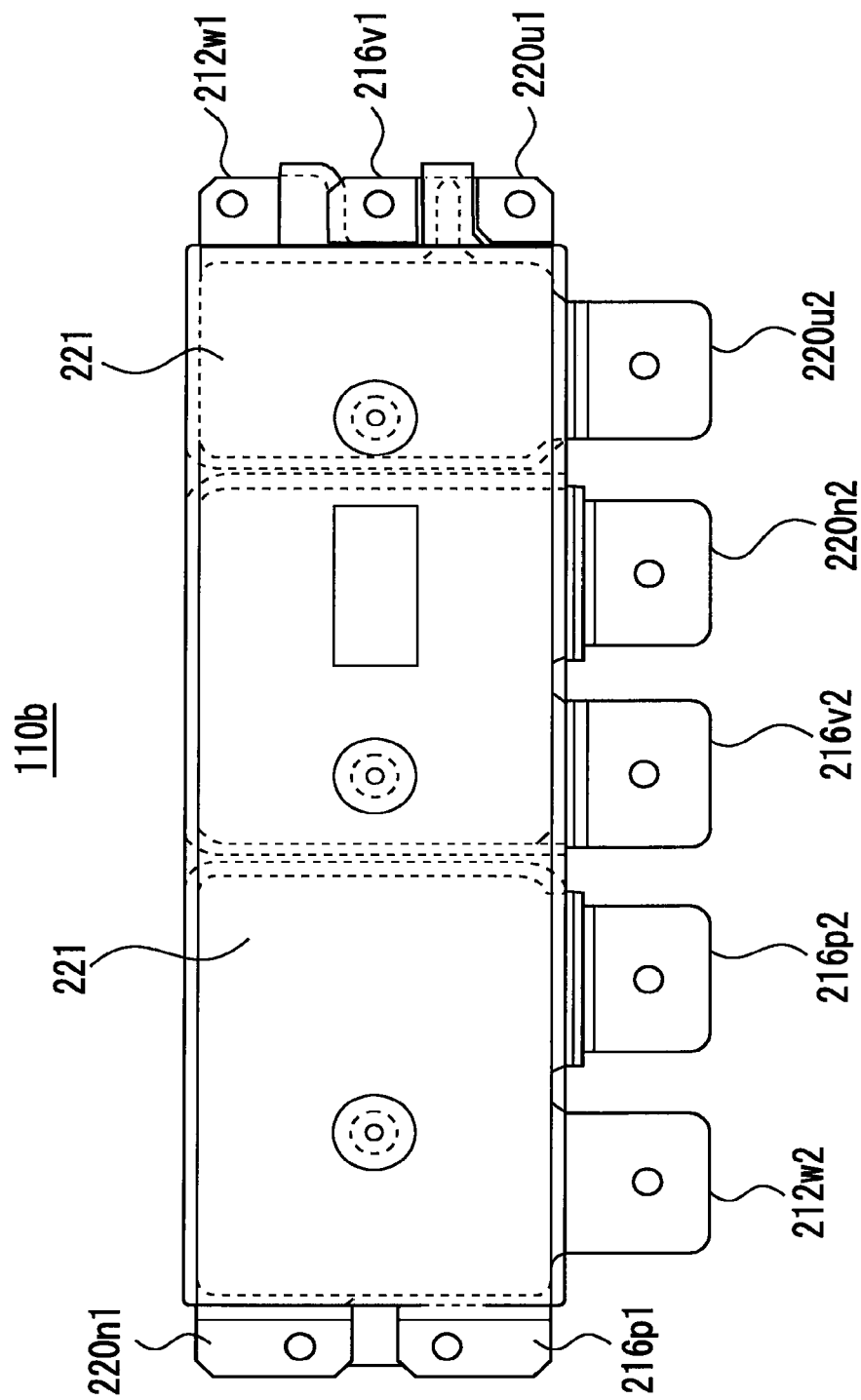
FIG. 20 is a top view of the second upper laminate bus bar included in the second power conversion unit according to the embodiment.

FIG. 19 is a perspective view of the second upper laminate bus bar 110b included in one of the second power conversion units 100b according to the embodiment. FIG. 20 is a top view of the second upper laminate bus bar 110b included in one of the second power conversion units 100b according to the embodiment. The second upper laminate bus bar 110b is provided with a positive DC input terminal 216p1, a negative DC input terminal 220n1, a positive DC intermediary terminal 216p2, a negative DC intermediary terminal 220n2, a first phase AC intermediary terminal 220u2, a second phase AC intermediary terminal 216v2, a third phase AC intermediary terminal 212w2, a first phase AC output terminal 220u1, a second phase AC output terminal 216v1, and a third phase AC output terminal 212w1.

Like the first upper laminate bus bar 110a, in a plan view of the second upper laminate bus bar 110b, the terminals described above are arranged on the periphery of the second upper laminate bus bar 110b. However, the second upper laminate bus bar 110b differs from the first upper laminate bus bar 110a in that the peripheral areas where the DC input terminals are provided and the peripheral areas where the AC output terminals are provided exist in an inverse positional relationship. Note that the arrangement order of the DC intermediary terminals and the AC intermediary terminals is the same for the second upper laminate bus bar 110b and the first upper laminate bus bar 110a.

Figure 21:
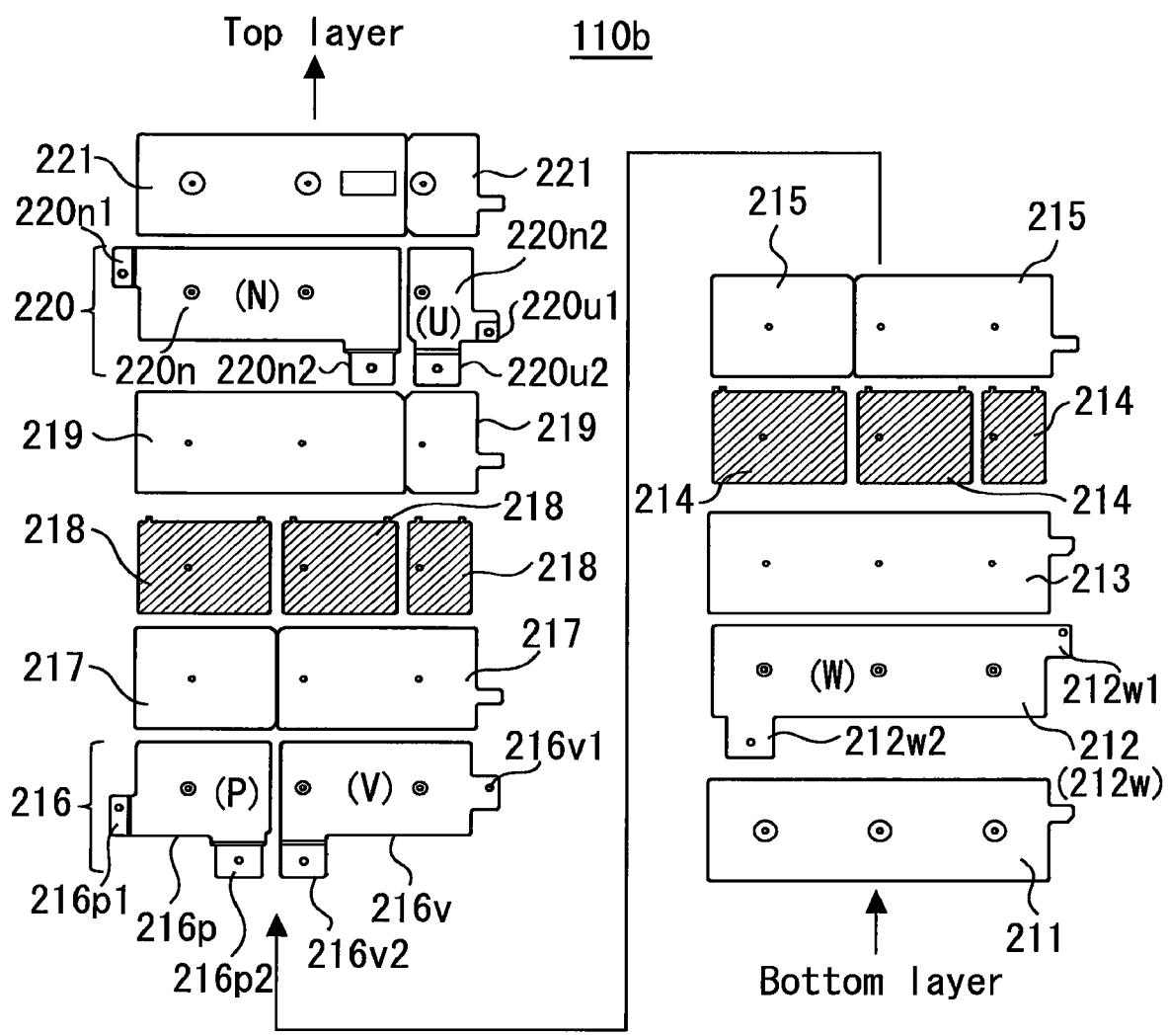
FIG. 21 is an exploded view of the second upper laminate bus bar included in the second power conversion unit according to the embodiment.

FIG. 21 is an exploded view of the second upper laminate bus bar 110b included in one of the second power conversion units 100b according to the embodiment. The second upper laminate bus bar 110b is a laminate of, in the following order, an insulating sheet 211, a fourth conductive layer 212, an insulating sheet 213, an insulating plate 214, an insulating sheet 215, a fifth conductive layer 216, an insulating sheet 217, an insulating plate 218, an insulating sheet 219, a sixth conductive layer 220, and an insulating sheet 221.

The fourth conductive layer 212 includes a fourth AC conductive plate 212w that handles third phase alternating current, that is, W phase alternating current. The fifth conductive layer 216 includes a fifth AC conductive plate 216v that handles second phase alternating current, that is, V phase alternating current, and a third DC conductive plate 216p that handles positive direct current. The sixth conductive layer 220 includes a sixth AC conductive plate 220u that handles first phase alternating current, that is, U phase alternating current, and a fourth DC conductive plate 220n that handles negative direct current.

Note that a detailed description of features such as the terminal structure included in each conductive plate of the second upper laminate bus bar 110b is omitted for the following reasons. The first reason is that the structure of the second upper laminate bus bar 110b mostly resembles the structure of the first upper laminate bus bar 110a, which has already been described in detail. The second reason is that the correspondence relationships between each conductive plate and the terminal structure is clear from the exploded view in FIG. 21 and the types of electrical characteristics to be handled.

A comparison between the exploded view of the first upper laminate bus bar 110a illustrated in FIG. 14 and the exploded view of the second upper laminate bus bar 110b illustrated in FIG. 21 clearly demonstrates that at least the pair of the insulating plate 114 and the insulating plate 214, the pair of the insulating plate 118 and the insulating plate 218, the pair of the insulating sheet 115 and the insulating sheet 215, and the pair of the insulating sheet 117 and the insulating sheet 217 exist in a line-symmetric relationship in which each has substantially the same shape mirrored left and right in the plane of the page. By sharing at least these members in common, manufacturing costs can be dramatically reduced.

Furthermore, a comparison between the structure of the conductive plates and insulating sheets other than the above-described between FIGS. 14 and 21 demonstrates that the pair of the first conductive layer 112 and the sixth conductive layer 220 and the pair of the second conductive layer 116 and the fifth conductive layer 216 have a certain similarity in the planar direction size and shape of the two divided conductive plates in each layer. More specifically, the certain similarity is a line-symmetry relationship with the substantially the same shape mirrored left and right in the plane of the page. By imparting such similarity in size and shape, manufacturing costs can be dramatically reduced.

REFERENCE SIGNS LIST 1, 1a, 301 Power conversion device
2, 302 Housing
2a, 302a Floor
2b, 302b Ceiling
2c Front face
2d Side face
2e Back face
9 Small input-side breaker
10a First input circuit part
10b Second input circuit part
20a First reactor
20b Second reactor
30 Output bus bar
32 Relay bus bar
40 Output circuit part
42, 340 Output-side breaker
50 Output terminal
52 Control circuit board
100a First power conversion unit
100b Second power conversion unit
101 Power conversion module
102 Wire
110a First upper laminate bus bar
110b Second upper laminate bus bar
111, 113, 115, 117, 118, 119, 121, 131, 133, 135, 139, 144, 211, 213, 215, 217, 219, 221 Insulating sheet
112 First conductive layer
112p First DC conductive plate
112p1, 216p1 Positive DC input terminal
112p2, 216p2 Positive DC intermediary terminal
112w First AC conductive plate
112w1, 212w2 Third phase AC intermediary terminal
112w2, 212w1 Third phase AC output terminal
114, 118, 214, 218 Insulating plate
116 Second conductive layer
116n Second DC conductive plate
116n1, 220n1 Negative DC input terminal
116p2, 220n2 Negative DC intermediary terminal
116v Second AC conductive plate
116v1, 216v2 Second phase AC intermediary terminal
116v2, 216v1 Second phase AC output terminal
120 Third conductive layer
120u Third AC conductive plate
120u1, 220u2 First phase AC intermediary terminal
120u2, 220u1 First phase AC output terminal
130a First lower laminate bus bar
132 Negative DC lower conductive plate
134 Conductive plate
138 Positive DC lower conductive plate
141 AC lower conductive plate
143w, 138p Lower intermediary terminal
200 Transformer
202 Transformer input terminal
212 Fourth conductive layer
212w Fourth AC conductive plate
216 Fifth conductive layer 216p Third DC conductive plate
216v Fifth AC conductive plate
220 Sixth conductive layer
220n Fourth DC conductive plate
220u Sixth AC conductive plate
310 Input breaker
315 Power conversion unit
320 Reactor
325, 403, 418 to 440 Metal bus bar
CL Reference axis
IN Power input terminal
OUT Power output terminal

The invention claimed is:

1. A power conversion device comprising:
a housing having a floor, a ceiling provided above the floor, and a front face, a back face, and a pair of side faces that join the floor and the ceiling;
an input circuit part, a power conversion unit, a reactor, and an output circuit part housed inside the housing; and
an output terminal provided in the ceiling,
wherein the input circuit part, the power conversion unit, the reactor, and the output circuit part are arranged in a planar direction of the front face so as not to overlap each other in a plan view of the front face,
the input circuit part is provided above the floor,
the output circuit part is provided below the ceiling and above the input circuit per,
the power conversion unit is provided between the input circuit part and the output circuit part, and the reactor is provided beside or above the power conversion unit between the input circuit part and the output circuit part, and
wherein, with an axis in a direction from the floor to the ceiling being considered as a vertical coordinate axis, the input circuit part, the power conversion unit, the reactor, and the output circuit part are connected in series in this order through a plurality of metal bus bars that each extend vertically,
wherein, in a case where a predetermined reference axis is provided to pass through the floor and the ceiling in a plan view of the front face,
the input circuit part includes a first input circuit part and a second input circuit part provided at a line-symmetric position with respect to the first input circuit part about the reference axis,
the power conversion unit includes a first power conversion unit and a second power conversion unit provided at a line-symmetric position with respect to the first power conversion unit about the reference axis, and
the reactor includes a first reactor and a second reactor provided at a line-symmetric position with respect to the first reactor about the reference axis.

2. The power conversion device according to claim 1, wherein the output circuit part includes:
a relay bus bar provided above the first reactor and the second reactor;
a breaker provided beside the relay bus bar; and
an output bus bar provided above the relay bus bar and beside the breaker.

3. The power conversion device according to claim 2, wherein the first power conversion unit, the first reactor, the second reactor, and the second power conversion unit are arranged in this order.

4. The power conversion device according to claim 1, wherein the input circuit part includes a plurality of input-side breakers connected to each other in parallel, wherein each of the plurality of input-side breakers is provided with a power input terminal.

5. The power conversion device according to claim 1, wherein the plurality of metal bus bars include:
a first metal bus bar having a first end connected to the input circuit part, a second end connected to the power conversion unit, and a first central part extending straight between the first end and the second end vertically in a plan view of the front face;
a second metal bus bar having a third end connected to the power conversion unit, a fourth end connected to the reactor, and a second central part extending straight between the third end and the fourth end vertically in a plan view of the front face; and
a third metal bus bar having a fifth end connected to the reactor, a sixth end connected to the output circuit part, and a third central part extending straight between the fifth end and the sixth end vertically in a plan view of the front face.

6. A power conversion device comprising:
a housing having a floor, a ceiling provided above the floor, and a front face, a back face, and a pair of side faces that join the floor and the ceiling;
an input circuit part, a power conversion unit, a reactor, and an output circuit part housed inside the housing; and
an output terminal provided in the ceiling,
wherein the input circuit part, the power conversion unit, the reactor, and the output circuit part are arranged in a planar direction of the front face so as not to overlap each other in a plan view of the front face,
the input circuit part is provided above the floor,
the output circuit part is provided below the ceiling and above the input circuit part,
the power conversion unit is provided between the input circuit part and the output circuit part, and the reactor is provided beside or above the power conversion unit between the input circuit part and the output circuit part, and
wherein, with an axis in a direction from the floor to the ceiling being considered as a vertical coordinate axis, the input circuit part, the power conversion unit, the reactor, and the output circuit part are connected in series in this order through a plurality of metal bus bars that each extend vertically,
wherein the plurality of metal bus bars include:
a first metal bus bar having a first end connected to the input circuit part, a second end connected to the power conversion unit, and a first central part extending straight between the first end and the second end vertically in a plan view of the front face;
a second metal bus bar having a third end connected to the power conversion unit, a fourth end connected to the reactor, and a second central part extending straight between the third end and the fourth end vertically in a plan view of the front face; and
a third metal bus bar having a fifth end connected to the reactor, a sixth end connected to the output circuit part, and a third central part extending straight between the fifth end and the sixth end vertically in a plan view of the front face.

* * * * *